United States Patent
Yu et al.

(10) Patent No.: US 9,685,557 B2
(45) Date of Patent: Jun. 20, 2017

(54) DIFFERENT LIGHTLY DOPED DRAIN LENGTH CONTROL FOR SELF-ALIGN LIGHT DRAIN DOPING PROCESS

(71) Applicant: APPLE INC., Cupertino, CA (US)

(72) Inventors: Cheng-Ho Yu, Cupertino, CA (US); Young Bae Park, Cupertino, CA (US); Shih Chang Chang, Cupertino, CA (US); Ting-Kuo Chang, Hsinchu (TW); Shang-Chih Lin, Taitung (TW)

(73) Assignee: Apple Inc., Cupertino, CA (US)

( * ) Notice: Subject to any disclaimer, the term of this patent is extended or adjusted under 35 U.S.C. 154(b) by 1135 days.

(21) Appl. No.: 13/801,261

(22) Filed: Mar. 13, 2013

(65) Prior Publication Data

US 2014/0103349 A1 Apr. 17, 2014
US 2016/0380112 A9 Dec. 29, 2016

Related U.S. Application Data

(63) Continuation-in-part of application No. 13/601,535, filed on Aug. 31, 2012, now Pat. No. 8,987,027.

(51) Int. Cl.
*H01L 29/786* (2006.01)
*H01L 29/66* (2006.01)
*H01L 27/12* (2006.01)

(52) U.S. Cl.
CPC .... *H01L 29/78651* (2013.01); *H01L 27/1288* (2013.01); *H01L 29/6675* (2013.01); *H01L 29/78621* (2013.01); *H01L 29/78645* (2013.01)

(58) Field of Classification Search
CPC ......... H01L 29/78651; H01L 29/78645; H01L 29/78621; H01L 29/78696; H01L 27/1288
(Continued)

(56) References Cited

U.S. PATENT DOCUMENTS 4,080,619 A   3/1978 Suzuki
4,958,205 A   9/1990 Takeda et al.
(Continued)

FOREIGN PATENT DOCUMENTS

EP   0376329   7/1990
EP   2048538   4/2009
(Continued)

OTHER PUBLICATIONS

U.S. Appl. No. 14/268,946, filed Apr. 22, 2014, Roudbar, et al.

*Primary Examiner* — Brian Jennison

(57) ABSTRACT

A method is provided for fabricating thin-film transistors (TFTs) for an LCD having an array of pixels. The method includes depositing a first photoresist layer over a portion of a TFT stack. The TFT stack includes a conductive gate layer, and a semiconductor layer. The method also includes doping the exposed semiconductor layer with a first doping dose. The method further includes etching a portion of the conductive gate layer to expose a portion of the semiconductor layer, and doping the exposed portion of the semiconductor layer with a second doping dose. The method also includes removing the first photoresist layer, and depositing a second photoresist layer over a first portion of the doped semiconductor layer in an active area of the pixels to expose a second portion of the doped semiconductor layer in an area surrounding the active area. The method further includes doping the second portion of the doped semiconductor layer with a third doping dose, the first dose being higher than the second dose and the third dose.

14 Claims, 17 Drawing Sheets

(58) Field of Classification Search
USPC .......................................................... 219/469
See application file for complete search history.

(56) References Cited

U.S. PATENT DOCUMENTS

| | | | |
|---|---|---|---|
| 5,075,237 A | 12/1991 | Wu | |
| 5,573,961 A * | 11/1996 | Hsu | H01L 29/66772 257/E21.415 |
| 5,642,129 A | 6/1997 | Zavracky et al. | |
| 5,668,613 A | 9/1997 | Kim et al. | |
| 5,698,902 A | 12/1997 | Uehara et al. | |
| 5,721,155 A | 2/1998 | Lee | |
| 5,990,492 A | 11/1999 | Kim et al. | |
| 5,994,721 A | 11/1999 | Zhong et al. | |
| 6,246,179 B1 | 6/2001 | Yamada | |
| 6,372,636 B1 | 4/2002 | Chooi et al. | |
| 6,406,928 B1 | 6/2002 | Jen | |
| 6,479,398 B1 | 11/2002 | Chen, Jr. | |
| 6,509,614 B1 | 1/2003 | Shih | |
| 6,525,342 B2 | 2/2003 | Amemiya | |
| 6,548,960 B2 | 4/2003 | Inukai | |
| 6,613,620 B2 | 9/2003 | Fujimoto et al. | |
| 6,686,273 B2 | 2/2004 | Hsu et al. | |
| 6,768,531 B2 | 7/2004 | Ochiai et al. | |
| 6,812,637 B2 | 11/2004 | Cok et al. | |
| 6,967,407 B2 | 11/2005 | Otani et al. | |
| 7,030,553 B2 | 4/2006 | Winters et al. | |
| 7,045,406 B2 | 5/2006 | Huotari et al. | |
| 7,129,634 B2 | 10/2006 | Boroson et al. | |
| 7,190,419 B2 | 3/2007 | Park | |
| 7,199,518 B2 | 4/2007 | Couillard | |
| 7,209,057 B2 | 4/2007 | Hashido et al. | |
| 7,227,542 B2 | 6/2007 | Koyama | |
| 7,402,468 B2 | 7/2008 | Park et al. | |
| 7,419,858 B2 | 9/2008 | Schuele et al. | |
| 7,510,891 B2 | 3/2009 | Chun et al. | |
| 7,550,306 B2 | 6/2009 | Park et al. | |
| 7,553,707 B2 | 6/2009 | Horino et al. | |
| 7,563,669 B2 | 7/2009 | Chittipeddi et al. | |
| 7,602,456 B2 | 10/2009 | Tanaka | |
| 7,609,342 B2 | 10/2009 | Yang et al. | |
| 7,671,939 B2 | 3/2010 | Araki et al. | |
| 7,759,857 B2 | 7/2010 | Vaufrey et al. | |
| 7,816,677 B2 | 10/2010 | Lee et al. | |
| 7,843,130 B2 | 11/2010 | Shimizu et al. | |
| 7,855,508 B2 | 12/2010 | Cok et al. | |
| 7,919,918 B2 | 4/2011 | Kim | |
| 7,952,104 B2 | 5/2011 | Leonardi et al. | |
| 7,956,825 B2 | 6/2011 | Kane | |
| 7,969,087 B2 | 6/2011 | Hwang et al. | |
| 7,973,470 B2 | 7/2011 | Cok | |
| 8,053,978 B2 | 11/2011 | Hwang et al. | |
| 8,064,028 B2 | 11/2011 | Katayama et al. | |
| 8,072,080 B2 | 12/2011 | Moriwaki | |
| 8,089,429 B2 | 1/2012 | Yamashita et al. | |
| 8,102,338 B2 | 1/2012 | Hwang et al. | |
| 8,133,748 B2 | 3/2012 | Yamazaki et al. | |
| 8,236,628 B2 | 8/2012 | Liu et al. | |
| 8,278,162 B2 | 10/2012 | Akimoto et al. | |
| 8,278,661 B2 | 10/2012 | Song | |
| 8,294,147 B2 | 10/2012 | Yamazaki et al. | |
| 8,297,991 B2 | 10/2012 | Adachi | |
| 8,339,531 B2 | 12/2012 | Yamauchi | |
| 8,363,197 B2 | 1/2013 | Matsuda et al. | |
| 8,368,674 B2 | 2/2013 | Kim et al. | |
| 8,377,762 B2 | 2/2013 | Eguchi et al. | |
| 8,427,607 B2 | 4/2013 | Lee et al. | |
| 8,455,872 B2 | 6/2013 | French | |
| 8,471,256 B2 | 6/2013 | Yamazaki et al. | |
| 8,508,562 B2 | 8/2013 | Akimoto et al. | |
| 8,508,709 B2 | 8/2013 | Huang et al. | |
| 8,552,655 B2 | 10/2013 | Ono | |
| 8,568,877 B2 | 10/2013 | Ferrari et al. | |
| 8,610,860 B2 | 12/2013 | Huang et al. | |
| 8,692,743 B2 | 4/2014 | Tsai et al. | |
| 8,859,947 B2 | 10/2014 | Adachi | |
| 2003/0076282 A1 | 4/2003 | Ikeda et al. | |
| 2007/0268229 A1 | 11/2007 | Kang et al. | |
| 2008/0252202 A1 | 10/2008 | Li et al. | |
| 2009/0102052 A1 | 4/2009 | Ryu | |
| 2010/0156771 A1 | 6/2010 | Lee et al. | |
| 2010/0330811 A1 | 12/2010 | Nagao | |
| 2011/0012125 A1 | 1/2011 | Nicholas | |
| 2011/0073864 A1* | 3/2011 | Liu | H01L 33/08 257/59 |
| 2011/0227850 A1 | 9/2011 | Oh et al. | |
| 2012/0087460 A1 | 4/2012 | Moriwaki | |
| 2012/0105495 A1 | 5/2012 | Choi | |
| 2012/0119211 A1 | 5/2012 | Lin | |
| 2012/0205658 A1 | 8/2012 | Yamazaki et al. | |
| 2012/0248455 A1 | 10/2012 | Van Gestel | |
| 2012/0268396 A1 | 10/2012 | Kim et al. | |
| 2012/0287102 A1 | 11/2012 | Toyomura et al. | |
| 2012/0299976 A1 | 11/2012 | Chen et al. | |
| 2013/0027646 A1 | 1/2013 | Cho et al. | |
| 2013/0069061 A1 | 3/2013 | Nakazawa | |
| 2013/0161622 A1 | 6/2013 | Lee | |
| 2013/0328053 A1 | 12/2013 | Roudbari et al. | |
| 2013/0335658 A1 | 12/2013 | Huang et al. | |
| 2013/0337596 A1 | 12/2013 | Hung et al. | |
| 2014/0061656 A1 | 3/2014 | Yu et al. | |
| 2014/0070225 A1 | 3/2014 | Yu et al. | |
| 2014/0084292 A1 | 3/2014 | Hung et al. | |
| 2014/0091390 A1 | 4/2014 | Hung et al. | |
| 2014/0104527 A1 | 4/2014 | Yang et al. | |
| 2014/0120657 A1 | 5/2014 | Hung et al. | |
| 2014/0203245 A1 | 7/2014 | Gupta et al. | |
| 2014/0204067 A1 | 7/2014 | Gupta | |
| 2014/0211120 A1 | 7/2014 | Yang et al. | |
| 2014/0225117 A1 | 8/2014 | Roudbari et al. | |
| 2014/0252317 A1 | 9/2014 | Gupta et al. | |

FOREIGN PATENT DOCUMENTS

| | | |
|---|---|---|
| JP | 2010056015 | 3/2010 |
| TW | 201142797 | 12/2011 |
| WO | WO 2011/030620 | 3/2011 |
| WO | WO 2011/151970 | 12/2011 |

* cited by examiner

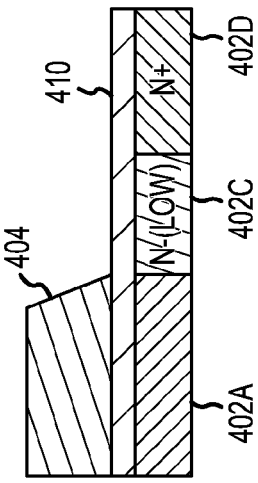
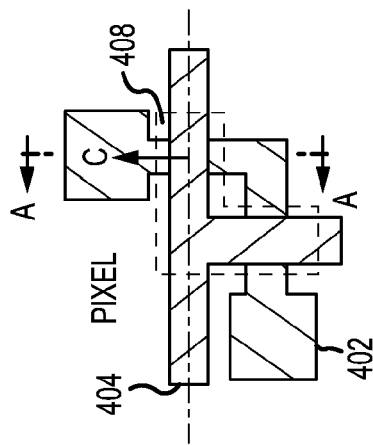
FIG. 4A (PRIOR ART)
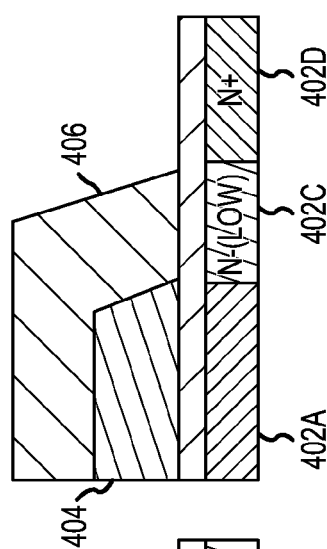
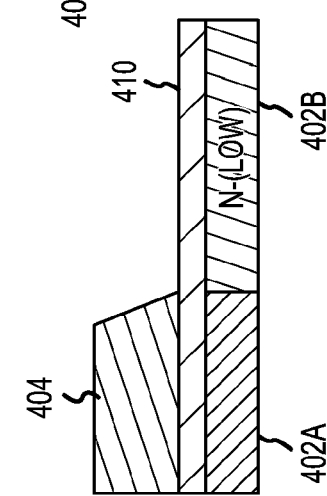
FIG. 4B
FIG. 4C
FIG. 4D

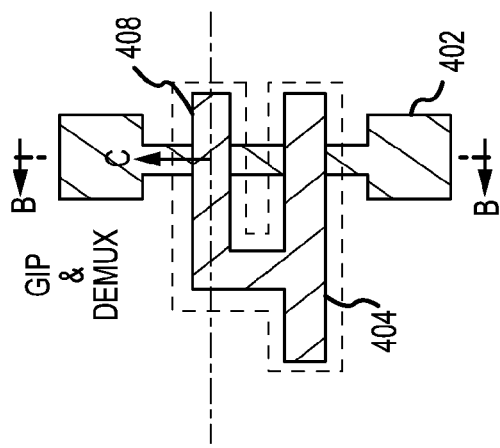
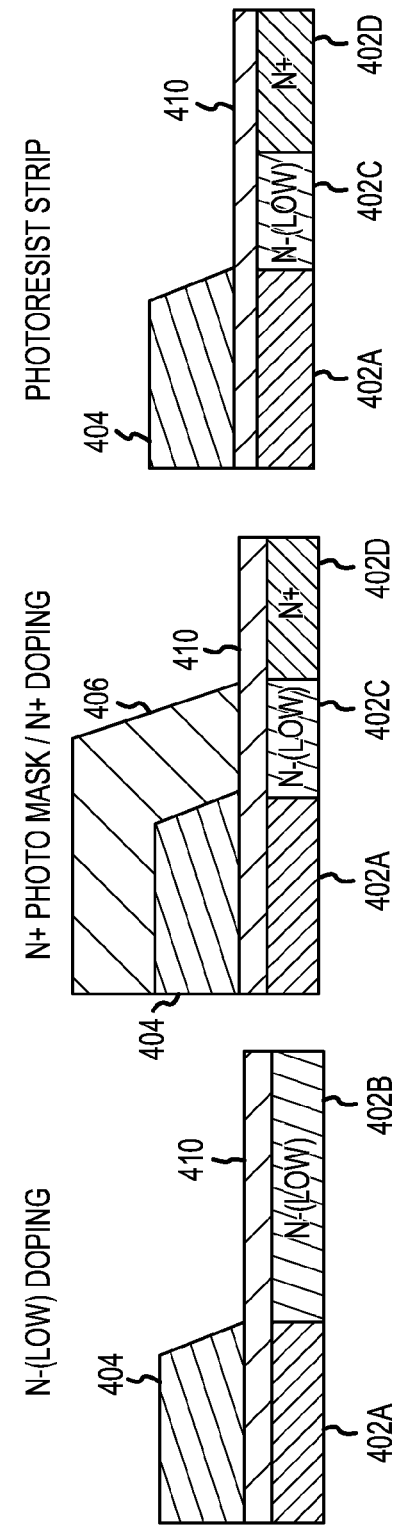

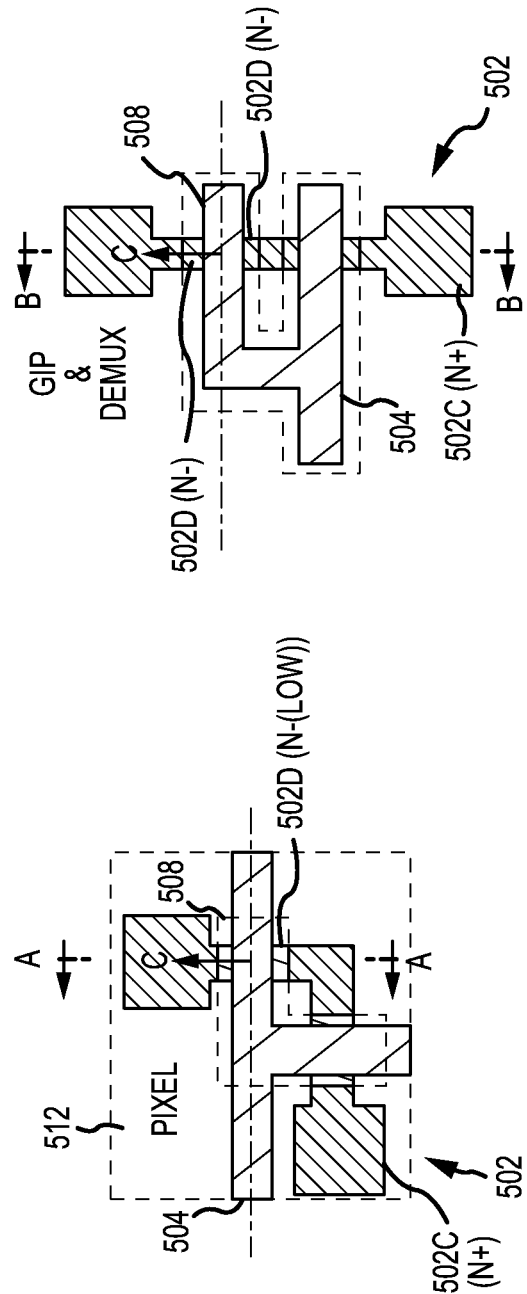

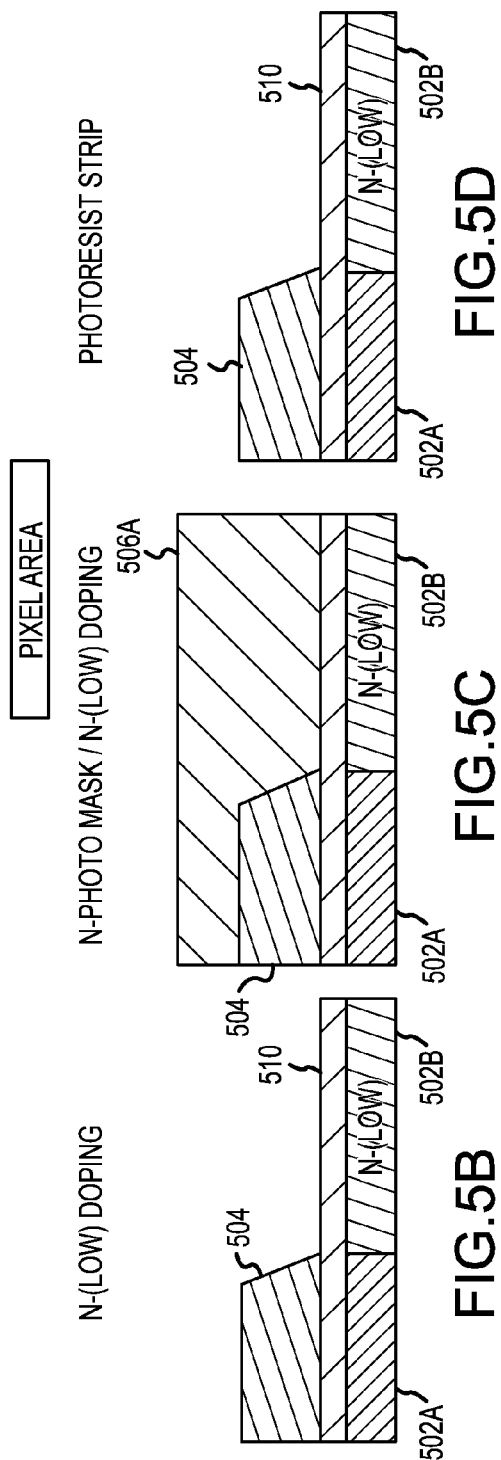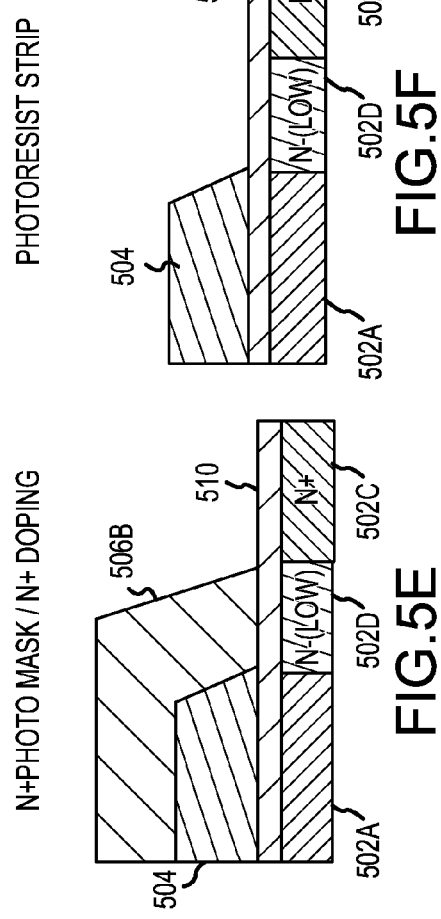

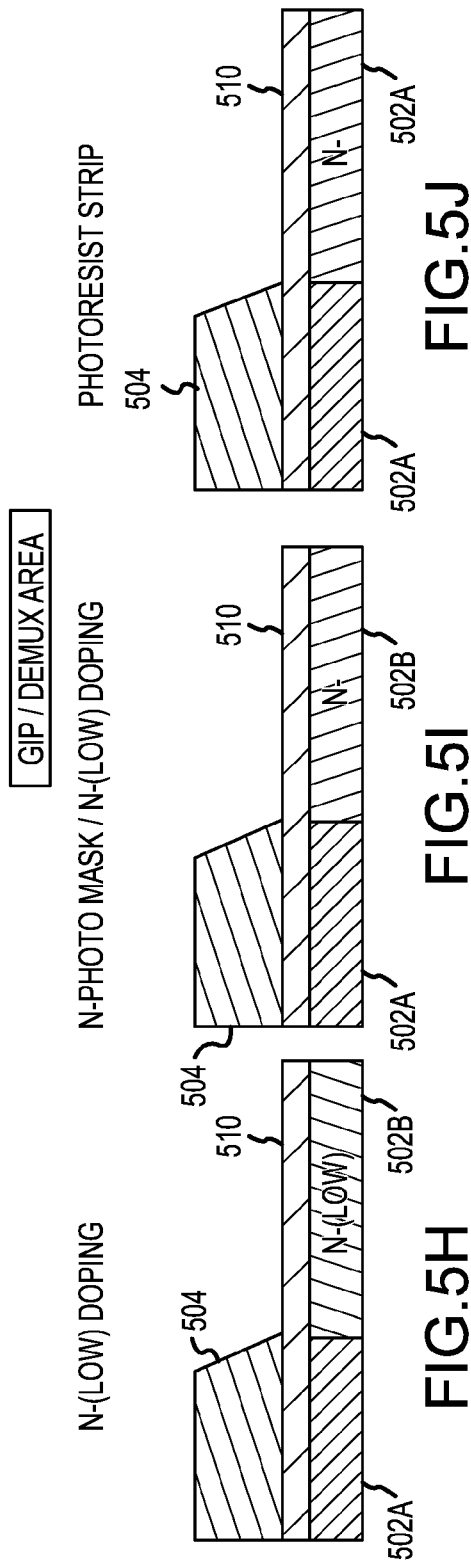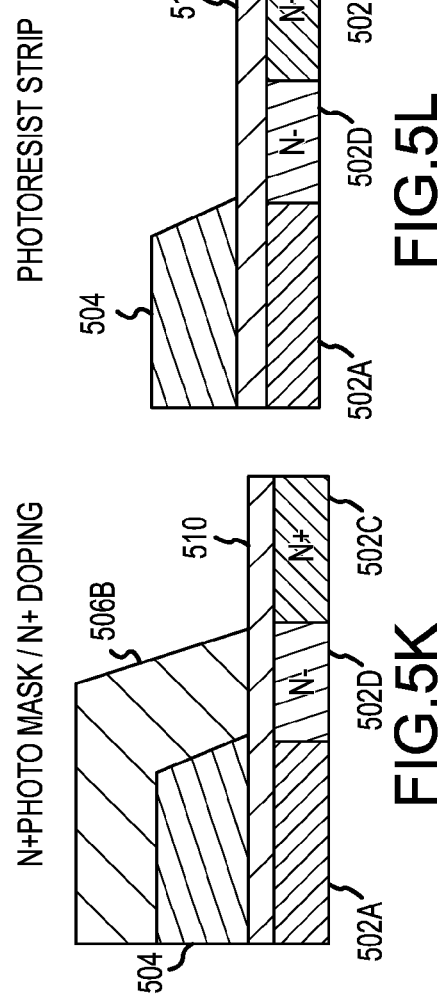

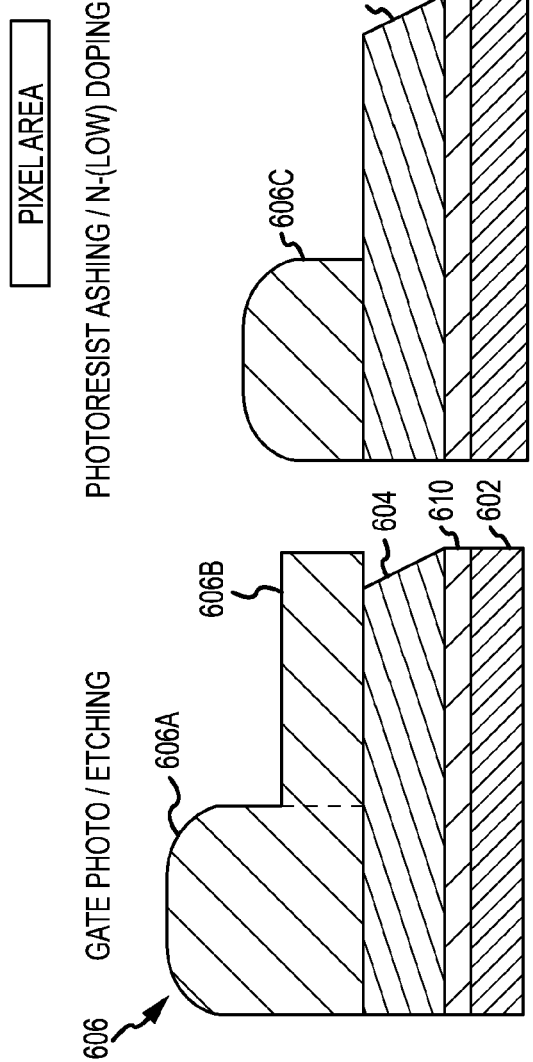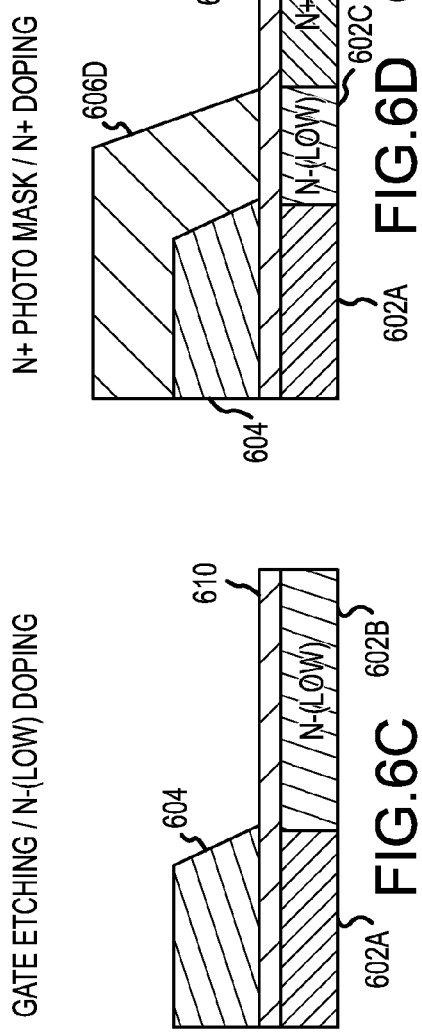

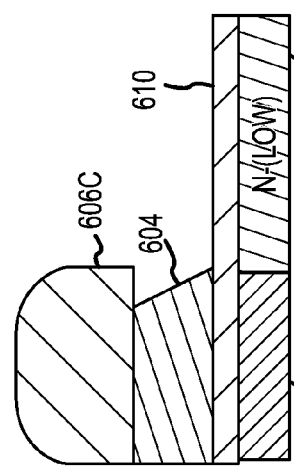
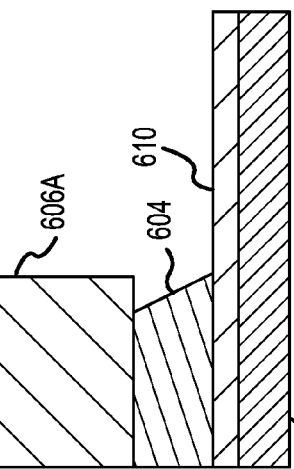
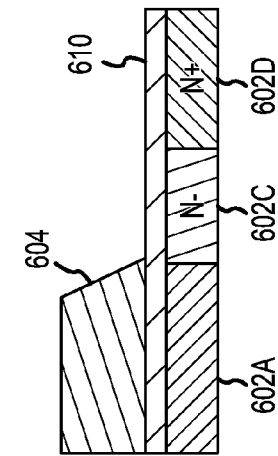
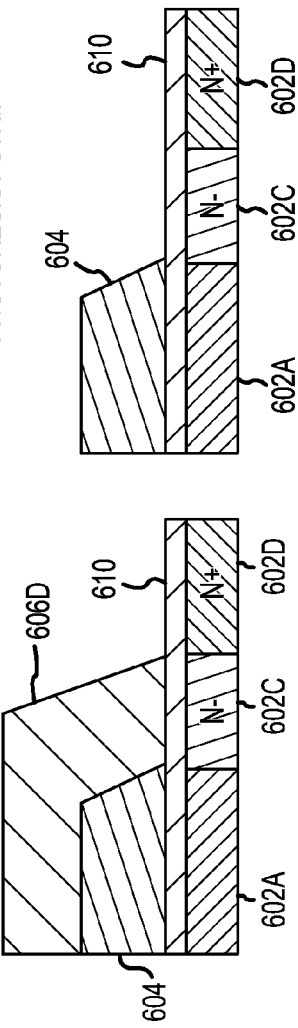
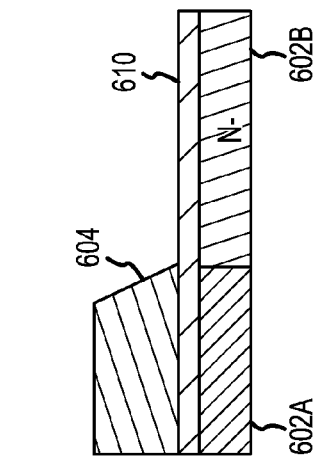

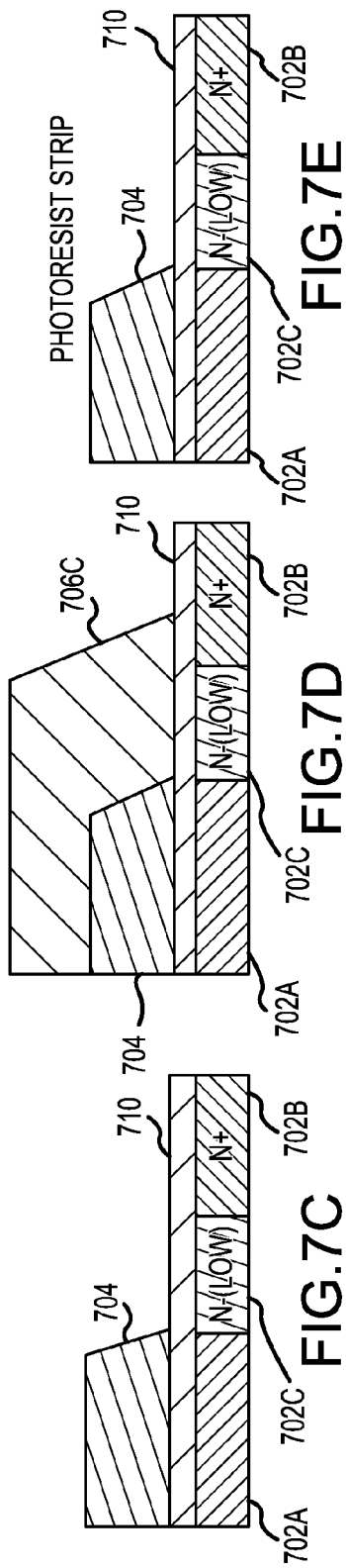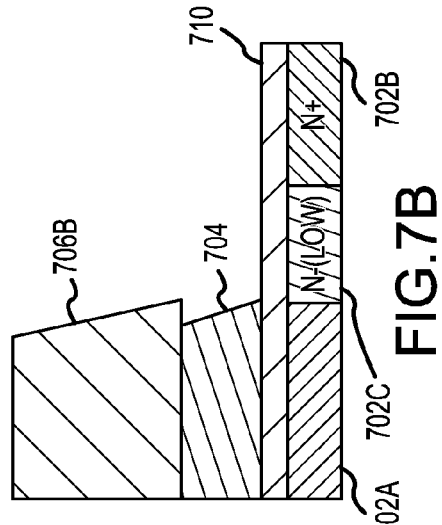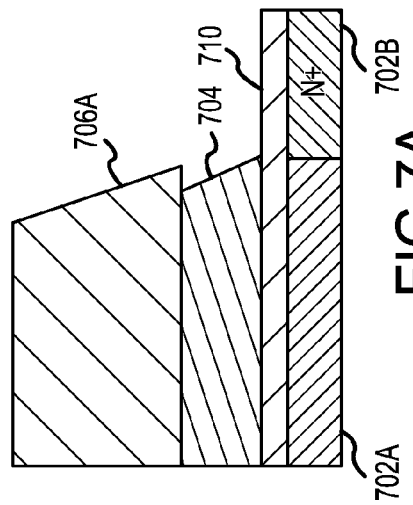

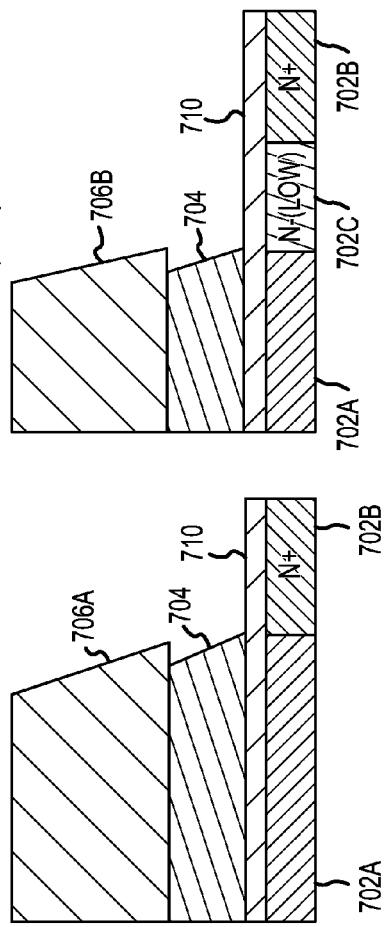
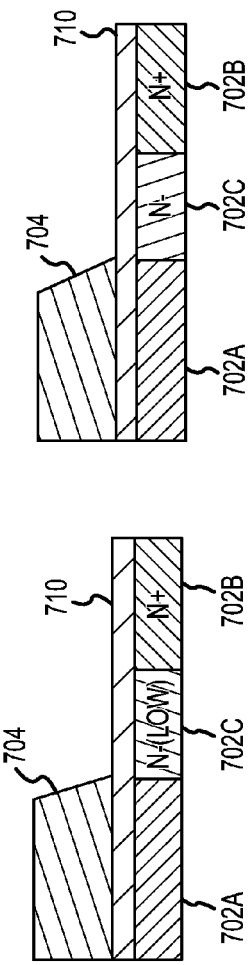

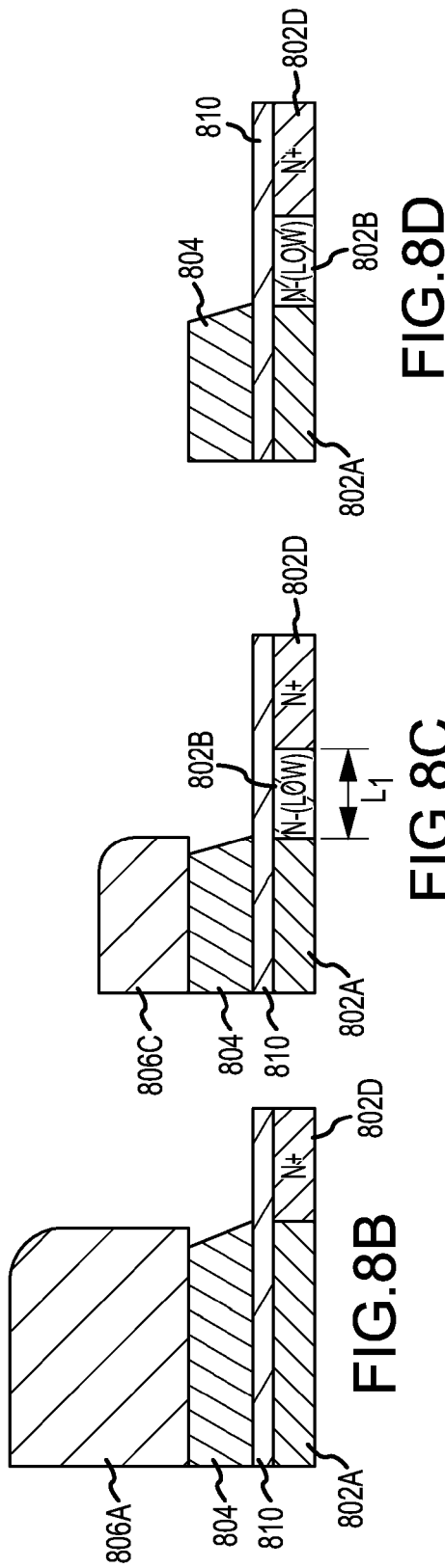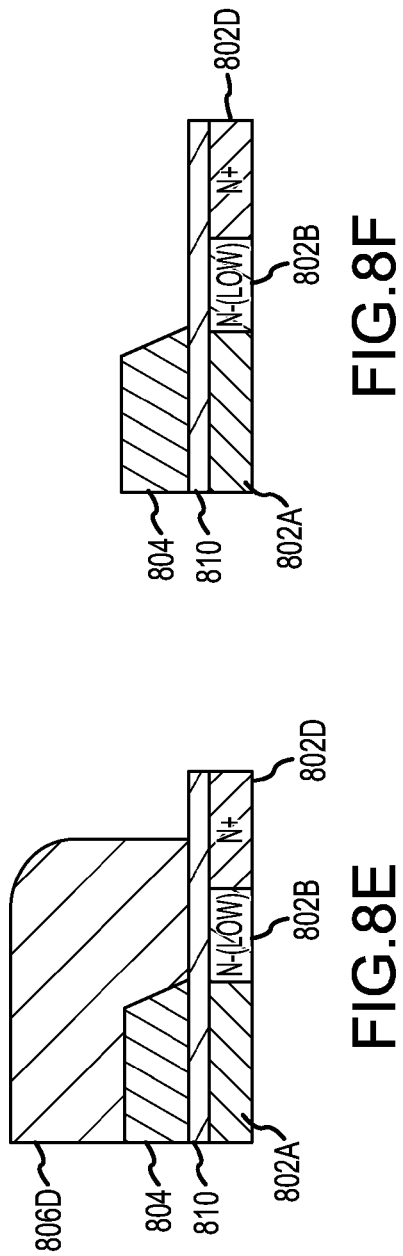

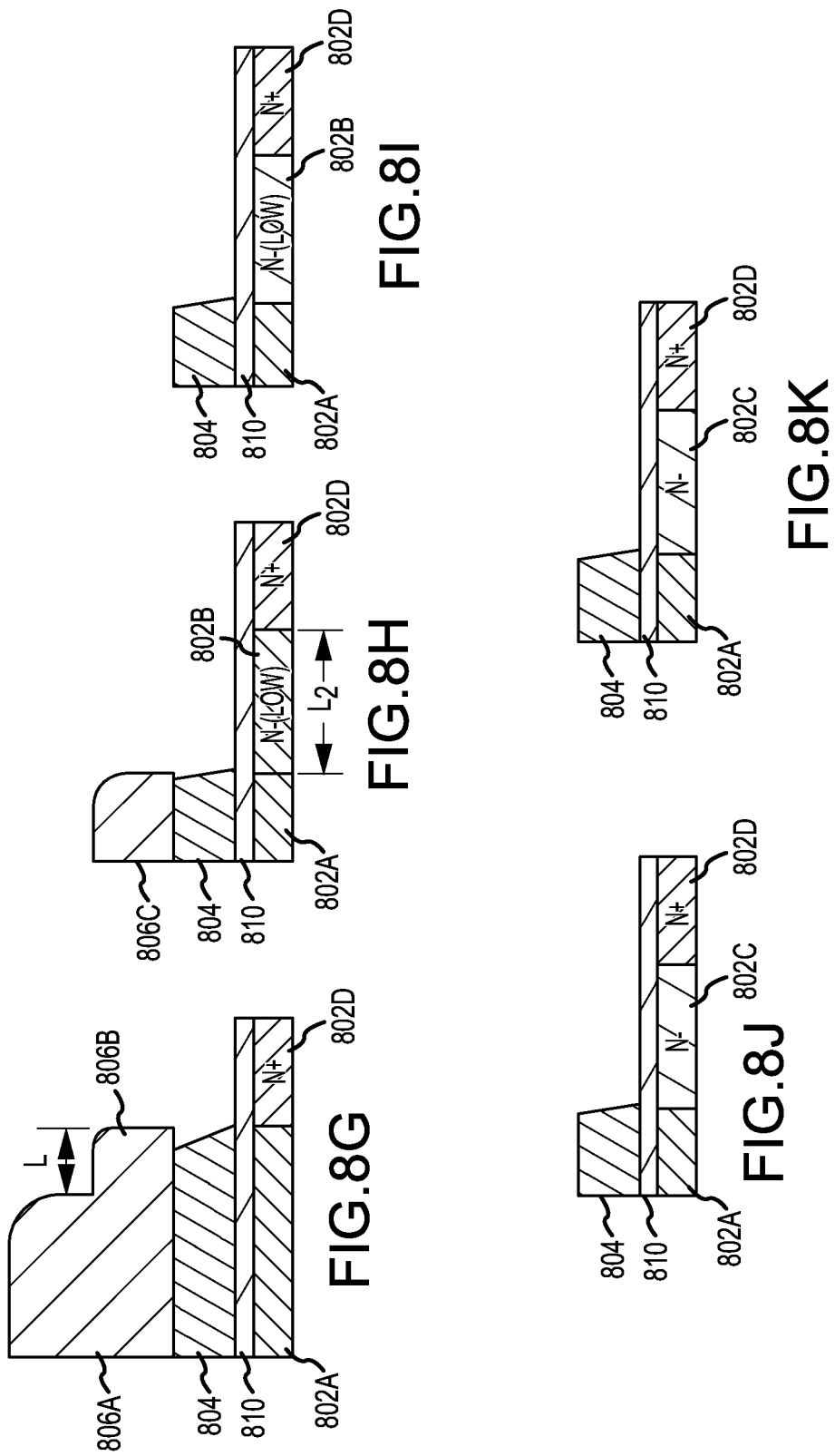

DIFFERENT LIGHTLY DOPED DRAIN LENGTH CONTROL FOR SELF-ALIGN LIGHT DRAIN DOPING PROCESS

CROSS-REFERENCE TO RELATED APPLICATION

The present application is a continuation-in-part application of U.S. patent application Ser. No. 13/601,535, entitled "Two Doping Regions in Lightly Doped Drain for Thin Film Transistors and Associated Doping Processes," filed on Aug. 31, 2012, which is incorporated herein by reference in its entirety.

TECHNICAL FIELD

The present invention generally relates to thin film transistors (TFT) for a liquid crystal display. More specifically, the invention relates to two doping regions having two different doping doses in lightly doped drain (LDD) area and associated LDD doping processes.

BACKGROUND

Liquid crystal displays (LCDs) generally display images by transmitting or blocking light through the action of liquid crystals. LCDs have been used in a variety of computing displays and devices, including notebook computers, desktop computers, tablet computing devices, mobile phones (including smart phones) automobile in-cabin displays, on appliances, as televisions, and so on. LCDs often use an active matrix to drive liquid crystals in a pixel region. In some LCDs, a thin-film transistor (TFT) is used as a switching element in the active matrix.

FIG. 1 illustrates a perspective view of a sample electronic device, such as a tablet computer. The electronic device includes a touch screen display 100 enclosed by a housing 138. The touch screen display 100 incorporates a touch panel 102 and an LCD, although alternative embodiments may employ an OLED layer instead of an LCD. The LCD is not shown in FIG. 1. Although a tablet computing device is illustrated in FIG. 1, it should be appreciated that the discussion herein may be equally applicable to any display and/or electronic device incorporating a display, such as a smart phone, notebook or laptop computer, all-in-one computing device, personal digital assistant, multimedia player, e-book reader, and so on.

FIG. 2 illustrates a cross-sectional view of a sample tablet computing device shown in FIG. 1 (the cross-section is shown by arrows 2-2 in FIG. 1). LCD 204 includes an array of pixels and an array of TFTs associated with the pixels. The LCD 204 may be coupled to the touch panel 102 by an optically clear adhesive (OCA) 206 or may have an air gap from the touch panel.

The LCD 204 may suffer from display noise, which may cross-couple to a capacitive touch sensing subsystem of the tablet computing device or other electronic device. Essentially, the capacitance between the gate and drain of a TFT for a given pixel may vary with a gate floating voltage, which depends upon the touch sensing subsystem, and thus acts as a parasitic capacitance on that subsystem. Thus, the display noise may interfere with detection of touches or other capacitive sense events during operation. For example, the display noise in the LCD 204 may be sensitive to finger touching on the touch panel 102. For example, a finger may be relatively cold or warm. The device 100 may be used in a hot and humid environment, or a cold and dry environment. It is desirable to develop techniques to reduce the display noise.

SUMMARY

Embodiments described herein may provide a thin-film transistor (TFT) for a liquid crystal display (LCD). The TFT may include two differently-doped regions formed by two separate doping operations. That is, the TFT may have a first LDD region having a first doping concentration in an active area of the pixels, and a second LDD region having a second doping concentration in an area surrounding the active area, for example where the gate-integrated panel (GIP) and demultiplexing circuitry are located. These two differently-doped regions may help reduce display noise generated from the touch panel operation. The disclosure also provides various embodiments for fabrication the TFT with two LDD doping regions having two different doping doses and two different lengths in an active area of the pixel, or the pixel area and in an area outside the active area, such as where the GIP and demultiplexing circuitry are arranged.

In one embodiment, a method is provided for fabricating thin-film transistors (TFTs) for an LCD having an array of pixels. The method includes depositing a first photoresist layer over a portion of a TFT stack. The TFT stack includes a conductive gate layer, and a semiconductor layer. The method also includes doping the exposed semiconductor layer with a first doping dose. The method further includes etching a portion of the conductive gate layer to expose a portion of the semiconductor layer, and doping the exposed portion of the semiconductor layer with a second doping dose. The method also includes removing the first photoresist layer, and depositing a second photoresist layer over a first portion of the doped semiconductor layer in an active area of the pixels to expose a second portion of the doped semiconductor layer in an area surrounding the active area. The method further includes doping the second portion of the doped semiconductor layer with a third doping dose, the first dose being higher than the second dose and the third dose.

In another embodiment, a method is provided for fabricating thin-film transistors (TFTs) for a liquid crystal display (LCD) having an array of pixels. The method includes depositing a first photoresist layer having a first portion of photoresist and a second portion of photoresist over a TFT stack. The second portion of photoresist is thinner than the first portion of photoresist. The TFT stack includes a conductive gate layer, and a semiconductor layer. The method also includes etching a portion of the conductive gate layer to expose a portion of the semiconductor layer in an area surrounding an active area of the pixels, ashing the second portion of the first photoresist layer to expose a portion of the conductive gate layer in the active area of the pixels, and doping the semiconductor layer in the area surrounding the active area with a first doping dose. The method further includes etching a portion of the conductive gate layer in the active area, and doping the semiconductor layer in both the active area and the area surrounding the active with a second doping dose.

In yet another embodiment, a method is provided for fabricating thin-film transistors (TFTs) for an LCD with an array of pixels. The method includes providing a TFT stack, the TFT stack having a portion in an active area of the array of the pixels and a second portion in the area surrounding the active area. The TFT stack includes a conductive gate layer, a gate insulation layer, and a semiconductor layer. The conductive gate layer covers a first portion of the semiconductor layer and exposing a second portion of the semiconductor layer. The method also includes doping the second portion of the semiconductor layer of the first and second portions of the TFT stack with a first doping dose. The method further includes depositing a first photoresist layer over the first portion of TFT stack in the active area while exposing the second portion of the TFT stack in the area surrounding the active area, and doping the doped semiconductor layer of the second portion of the TFT stack with a second doping dose.

In still yet another embodiment, a TFT stack for a liquid crystal display (LCD) having an array of pixels is provided. The TFT stack includes a first region of the TFT stack in an active area of the pixels and a second region of the TFT stack in an area surrounding the active area. The TFT stack includes a semiconductor layer having a non-doped region connected to a doped region. The doped region includes a lightly doped drain (LDD) region and a heavily doped region. The LDD region is between the non-doped region and the heavily doped region. The first region of the TFT stack includes a first gate electrode portion over a first portion of the non-doped region of the semiconductor layer, and a first portion of the LDD region having a first doping dose. The second region of the TFT stack includes a second gate electrode portion over a second portion of the non-doped region of the semiconductor layer, and a second portion of the LDD region having a second doping dose.

In still yet another embodiment, a method is provided for fabricating thin-film transistors (TFTs) for a liquid crystal display (LCD) having an array of pixels. The method includes placing a first photoresist mask over a TFT stack including a conductive gate layer, and a semiconductor layer. The mask has a thicker portion of photoresist covering a pixel area, and a half tone mask with a thicker portion of photoresist and a thinner portion of photoresist near edge covering an area surrounding the pixel area. The method also includes ashing a top portion of the first photoresist such that the thinner portion of the photoresist is removed, and etching a portion of the conductive gate layer to expose a portion of the semiconductor layer. The method further includes doping the semiconductor layer with a first doping dose such that a length of light drain doping (LDD) region in the pixel area is shorter than a length of the LDD in the area surrounding the pixel area.

In still yet another embodiment, a TFT stack is provided for a liquid crystal display (LCD) having an array of pixels. The TFT stack includes a first region of the TFT stack in an active area of the pixels and a second region of the TFT stack in an area surrounding the active area. The TFT stack includes a semiconductor layer having a non-doped region connected to a doped region, the doped region having a lightly doped drain (LDD) region and a heavily doped region, the LDD region between the non-doped region and the heavily doped region. The first region of the TFT stack includes a first gate metal portion over a first portion of the non-doped region of the semiconductor layer, and a first portion of the LDD region having a first length. The second region of the TFT stack includes a second gate metal portion over a second portion of the non-doped region of the semiconductor layer, and a second portion of the LDD region having a second length.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

FIG. 4A shows a sample top view of gate metal or gate electrode, semiconductor, and N+ photo mask in the pixel area for one-step LDD doping process in an embodiment.

FIG. 4B shows a sample cross-sectional view of a TFT stack in the pixel area after a first LDD doping or N− (low) doping using a one-step LDD doping process in an embodiment.

FIG. 4C shows a sample cross-sectional view of the TFT stack in the pixel area after patterning photoresist with a N+ photo mask and a second doping or N+ doping following the operation illustrated in FIG. 4B.

FIG. 4D shows a sample cross-sectional view of the TFT stack in the pixel area after photoresist stripping following the operation illustrated in FIG. 4C.

FIG. 4E shows a sample top view of the gate metal, semiconductor, and N+ photo mask of FIG. 4A in the GIP/demultiplexing areas for the one-step LDD doping process of FIG. 4A.

FIG. 4F shows a sample cross-sectional view of the TFT stack of FIG. 4B in the GIP/demultiplexing area after the first doping or N− (low) doping for the one-step LDD doping process of FIG. 4B.

FIG. 4G shows a sample cross-sectional view of the TFT stack of FIG. 4C in the GIP/demultiplexing area after patterning photoresist with the N+ photo mask of FIG. 4C following the operation illustrated in FIG. 4F.

FIG. 4H shows a sample cross-sectional view of the TFT stack of FIG. 4D in the GIP/demultiplexing area after the photoresist stripping of FIG. 4D following the operation illustrated in FIG. 4G.

FIG. 5A shows a sample top view of a gate metal or gate electrode, a semiconductor, a N− photo mask, and a N+ photo mask in the pixel area for a two-step LDD doping process.

FIG. 5B shows a sample cross-sectional view of a TFT stack in the pixel area after a first doping or N− (low) doping for a two-step LDD doping process.

FIG. 5C shows a sample cross-sectional view of the TFT stack in the pixel area after patterning photoresist with a N− photo mask and a second doping denoted by N− (low) following the operation illustrated in FIG. 5B.

FIG. 5D shows a sample cross-sectional view of the TFT stack in the pixel area after photoresist stripping following the operation illustrated in FIG. 5C.

FIG. 5E shows a sample cross-sectional view of the TFT stack in the pixel area after patterning photoresist with a N+ photo mask and a third doping following the operation illustrated in FIG. 5D.

FIG. 5F shows a sample cross-sectional view of the TFT stack in the pixel area after photoresist stripping following the operation illustrated in FIG. 5E.

FIG. 5G shows a sample top view of the gate metal, semiconductor, and N+ photo mask of FIG. 5A for the GIP/demultiplexing areas for the two-step LDD doping process of FIG. 5A.

FIG. 5H shows a sample cross-sectional view of the TFT stack of FIG. 5B in the GIP/demultiplexing area after the first doping or N− (low) doping of FIG. 5B.

FIG. 5I shows a sample cross-sectional view of the TFT stack of FIG. 5C in the GIP/demultiplexing area after a second doping or N− (low) doping following the operation illustrated in FIG. 5H.

FIG. 5J shows a sample cross-sectional view of the TFT stack of FIG. 5D in the GIP/demultiplexing area after photoresist stripping following the operation illustrated in FIG. 5I.

FIG. 5K shows a sample cross-sectional view of the TFT stack of FIG. 5E in the GIP/demultiplexing area after patterning photoresist with the N+ photo mask and the third doping or N+ doping of FIG. 5E following the operation illustrated in FIG. 5J.

FIG. 5L shows a sample cross-sectional view of photoresist stripping of FIG. 5F following the operation illustrated in FIG. 5K.

FIG. 6A shows a sample cross-sectional view of a TFT stack in the pixel area after gate etching for a half-tone mask LDD doping process.

FIG. 6B shows a sample cross-sectional view of the TFT stack in the pixel area after half-tone photoresist ashing following the operation illustrated in FIG. 6A.

FIG. 6C shows a sample cross-sectional view of the TFT stack in the pixel area after gate etching and a second doping denoted by N− (low) following the operation illustrated in FIG. 6B.

FIG. 6D shows a sample cross-sectional view of the TFT stack in the pixel area after patterning photoresist with a N+ photo mask and a third doping or N− (low) doping following the operation illustrated in FIG. 6C.

FIG. 6E shows a sample cross-sectional view of the TFT stack in the pixel area after photoresist stripping following the operation illustrated in FIG. 6D.

FIG. 6F shows a sample cross-sectional view of the TFT stack of FIG. 6A in the GIP/demultiplexing area after gate and photoresist etching for the half-tone mask LDD doping process of FIG. 6A.

FIG. 6G shows a sample cross-sectional view of the TFT stack of FIG. 6B in the GIP/demultiplexing area after photoresist ashing and the first doping or N− (low) doping of FIG. 6B following the operation illustrated in FIG. 6F.

FIG. 6H shows a sample cross-sectional view of the TFT stack of FIG. 6C in the GIP/demultiplexing area after photoresist stripping and the second doping denoted by N− (low) of FIG. 6C following the operation illustrated in FIG. 6G.

FIG. 6I shows a sample cross-sectional view of the TFT stack of FIG. 6D in the GIP/demultiplexing area after patterning photoresist with the N+ photo mask and the third doping or N+ doping following the operation illustrated in FIG. 6H.

FIG. 6J shows a sample cross-sectional view of the TFT stack of FIG. 6E in the GIP/demultiplexing area after photoresist stripping of FIG. 6E following the operation illustrated in FIG. 6I.

FIG. 7A shows a sample cross-sectional view of a TFT stack in the pixel area after gate etching and a first doping or N+ doping in the pixel area for an LDD doping process.

FIG. 7B shows a sample cross-sectional view of the TFT stack in the pixel area after photoresist ashing and gate etching and a second doping or N− (low) doping following the operation illustrated in FIG. 7A.

FIG. 7C shows a sample cross-sectional view of the TFT stack in the pixel area after photoresist stripping following the operation illustrated in FIG. 7B.

FIG. 7D shows a sample cross-sectional view of the TFT stack in the pixel area after patterning photoresist with a N− photo mask and a third doping or N− (low) doping following the operation illustrated in FIG. 7C.

FIG. 7E shows a sample cross-sectional view of the TFT stack in the pixel area after photoresist stripping following the operation illustrated in FIG. 7D.

FIG. 7F shows a sample cross-sectional view of the TFT stack of FIG. 7A in the GIP/demultiplexing areas after gate etching and the first doping or N+ doping for the self-LDD doping process of FIG. 7A.

FIG. 7G shows a sample cross-sectional view of the TFT stack of FIG. 7B in the GIP/demultiplexing areas after photoresist ashing and gate etching and the second doping or N− (low) doping of FIG. 7B following the operation illustrated in FIG. 7F.

FIG. 7H shows a sample cross-sectional view of the TFT stack of FIG. 7C in the GIP/demultiplexing areas after photoresist stripping of FIG. 7C following the operation illustrated in FIG. 7G.

FIG. 7I shows a sample cross-sectional view of the TFT stack of FIG. 7D in the GIP/demultiplexing areas after the third doping or N− (low) doping of FIG. 7D following the operation illustrated in FIG. 7H.

FIG. 7J shows a sample cross-sectional view of the TFT stack of FIG. 7E in the GIP/demultiplexing areas after photoresist stripping of FIG. 7E following the operation illustrated in FIG. 7I.

FIG. 8B shows a sample cross-sectional view of a TFT stack in the pixel area after gate etching and N+ doping for SALDD process.

FIG. 8C shows a sample cross-sectional view of the TFT stack in the pixel area after half-tone photoresist ashing, gate etching, and first N− doping following the operation illustrated in FIG. 8B.

FIG. 8D shows a sample cross-sectional view of the TFT stack in the pixel area after photoresist stripping following the operation illustrated in FIG. 8C.

FIG. 8E shows a sample cross-sectional view of the TFT stack in the pixel area after placing N− photo mask and second N− doping following the operation illustrated in FIG. 8D.

FIG. 8F shows a sample cross-sectional view of the TFT stack in the pixel area after photoresist stripping following the operation illustrated in FIG. 8E.

FIG. 8G shows a sample cross-sectional view of the TFT stack of FIG. 8B in the GIP/demultiplexing area after gate etching and N+ doping for the SALDD process of FIG. 8B.

FIG. 8H shows a sample cross-sectional view of the TFT stack of FIG. 8C in the GIP/demultiplexing area after photoresist ashing and a second doping or N− (low) doping following the operation illustrated in FIG. 8G.

FIG. 8I shows a sample cross-sectional view of the TFT stack of FIG. 8D in the GIP/demultiplexing area after photoresist stripping following the operation illustrated in FIG. 8H.

FIG. 8J shows a sample cross-sectional view of the TFT stack of FIG. 8E in the GIP/demultiplexing area after placing N− photo mask and second N− doping following the operation illustrated in FIG. 8I.

FIG. 8K shows a sample cross-sectional view of the TFT stack of FIG. 8F in the GIP/demultiplexing area after photo resist stripping following the operation illustrated in FIG. 8J.

DETAILED DESCRIPTION

The present disclosure may be understood by reference to the following detailed description, taken in conjunction with the drawings as described below. It is noted that, for purposes of illustrative clarity, certain elements in various drawings may not be drawn to scale.

Figure 1:
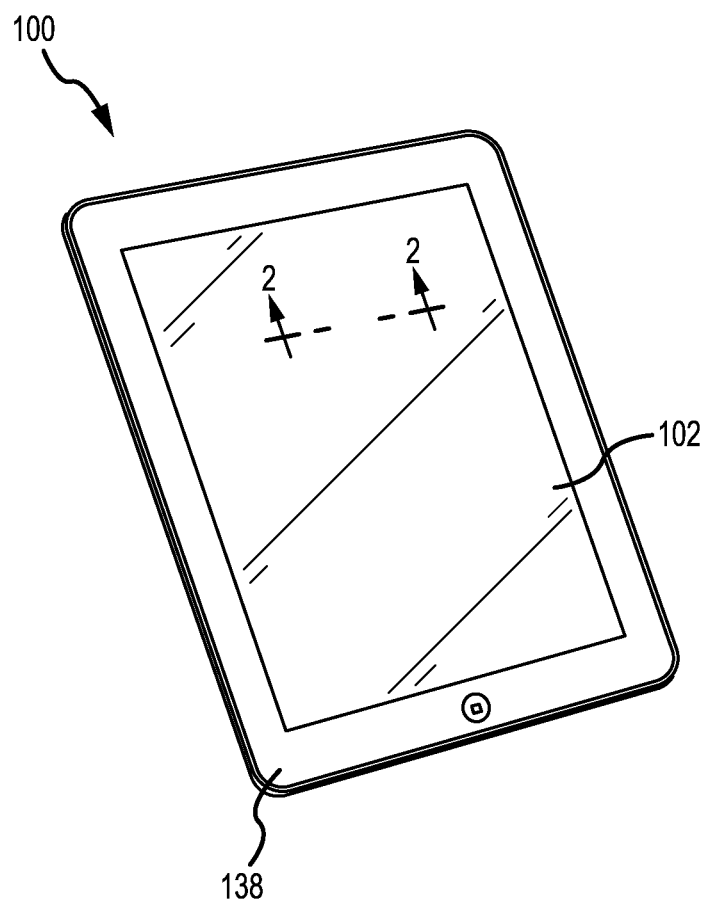
FIG. 1 illustrates a perspective view of a sample tablet computing device.
Figure 2:
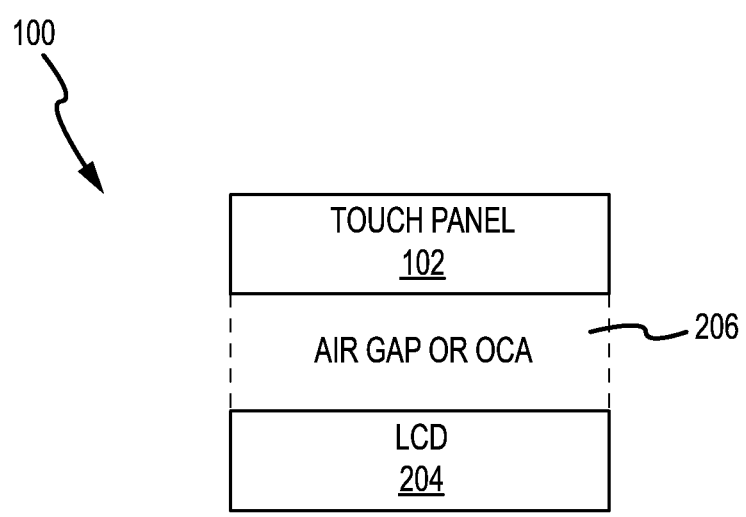
FIG. 2 illustrates a cross-sectional view of the tablet computing device of FIG. 1.
Figure 3:
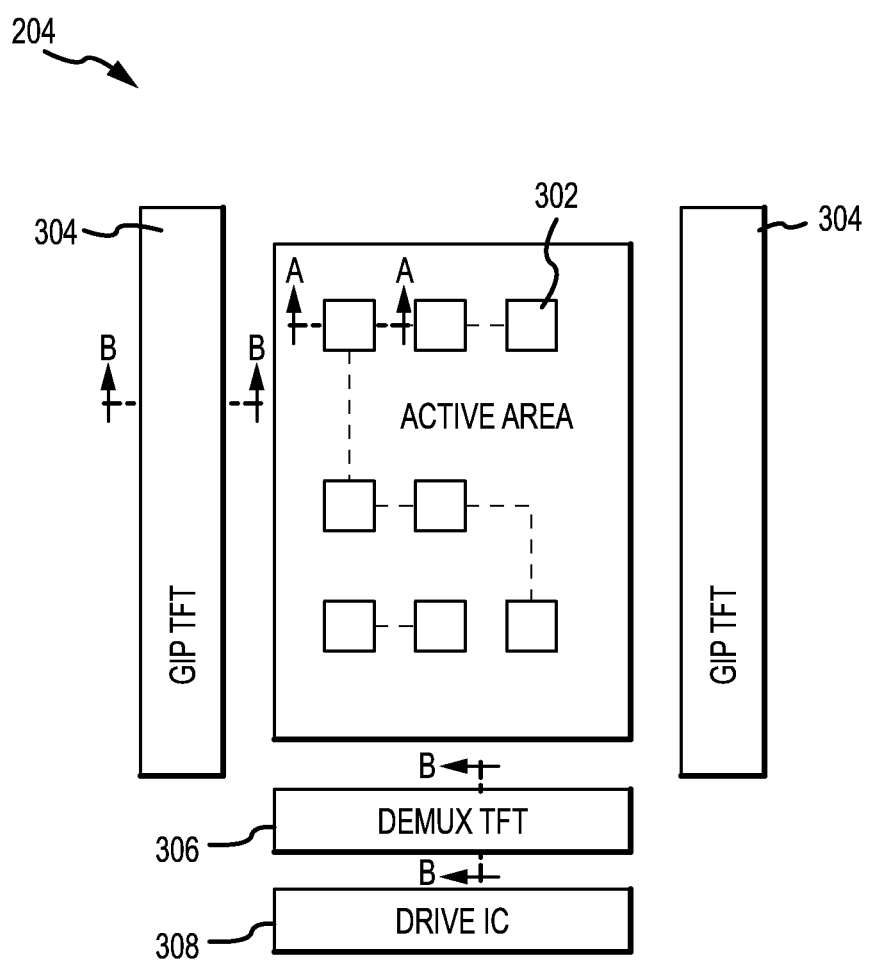
FIG. 3 shows a simplified diagram illustrating the arrangement of an array of pixels and the GIP TFT and demultiplexing TFT as well as integrated circuits (IC) for a touch panel in an embodiment.

FIG. 3 shows a simplified diagram illustrating the arrangement of an array of pixels and the GIP TFT and demultiplexing TFT as well as integrated circuits for touch panel in an embodiment. As shown, the array of pixels 302 or active area is surrounded by the GIP TFT 304 and the demultiplexing TFT 306. Each pixel 302 includes a TFT for switching the pixel on and off. The GIP TFT 302 is used for driving gate lines of the pixel structures, while the demultiplexing TFT 306 is used for driving data lines of the pixel structures. The integrated circuit 308 typically is positioned nearby the demultiplexing TFT 306, although this need not be the case. Cross-sectional views of the TFT stack of the pixel 302 and the GIP/TFT 304 and demultiplexing TFT 306 are shown in FIGS. 4-7. The TFT stack includes a semiconductor layer, a gate metal layer (also called a gate electrode), and an insulator layer between the gate metal layer and the semiconductor layer. The semiconductor layer includes a non-doped region under the gate metal, a lightly doped region next to the non-doped region, and a heavily doped region next to the lightly doped region. Photoresist is used to assist in forming a predetermined gate pattern and predetermined doping regions, and is removed after etching.

Conventionally, one LDD doping operation is used to create the lightly doped regions for the TFT in both the pixel (or active) area and the gate integrated panel (GIP)/demultiplexing area that surrounds the active area. As shown in FIG. 4D for the pixel area, the LDD doping dose is N− (low). Similarly, as shown in FIG. 4H for the GIP/demultiplexing area, the LDD doping dose is also N− (low). Therefore, the doping dose is the same for both the pixel area and the GIP and demultiplexing area.

One embodiment as discussed in the present disclosure provides two LDD doping doses (e.g., doping operations), one LDD doping dose or concentration being applied the pixel area and another LDD doping dose applied to the GIP and demultiplexing areas. For example, the LDD doping dose for the pixel area is denoted as N− (low) (e.g., low doping) while the LDD doping dose for the GIP and demultiplexing area is denoted as N− (e.g., low doping), which may be higher than the doping denoted by N− (low) for the pixel area.

The benefit of having a first LDD doped region, with a first dopant concentration, for the pixel area and a second LDD doping doped region, with a second dopant concentration, for the GIP and demultiplexing areas is that the display touch cross-talk (DTX) or display noise may be reduced. The two LDD doped regions may help reduce the sensitivity of the capacitive touch sensing subsystem circuitry to display noise.

Generally, doping introduces impurities into a pure or an intrinsic semiconductor to modulate electrical properties of the semiconductor. The impurities are dependent upon the type of semiconductor. The doping dose or concentration affects the electrical properties. For example, a higher doping dose may increase electrical conductivity.

FIGS. 4A-4D illustrate top and cross-sectional views of a TFT stack for the pixel area at various process steps for a conventional one-step LDD doping process. FIGS. 4E-4G illustrate top and cross-sectional views of the TFT stack for the GIP and demultiplexing area during the corresponding process steps shown in FIGS. 4A-4D. For each process step, a pair of figures, for example, FIGS. 4B and 4F, illustrate doping dose in the LDD region of the semiconductor layer for the pixel area and the GIP/demultiplexing areas. The LDD doping dose of the semiconductor layer may vary with the arrangement of the top layers above the semiconductor layer. For example, if the semiconductor is covered by the gate metal or photoresist, the semiconductor layer is not exposed to doping, such that the doping concentration does not change for the area covered during doping FIG. 4A shows a sample top view of gate metal, semiconductor, and N+ photo mask in the pixel area, corresponding to a conventional one-step LDD doping process in an embodiment. As shown, the gate metal has a T-shape. The N+ photo mask has a substantially rectangular shape and overlaps with a portion of the gate metal 404. The semiconductor 402 has some overlapping region with the gate metal and the N+ photo mask. The non-overlapping region between the semiconductor 402 and the N+ photo mask will be doped heavily when dosed with a dopant, as it is not shielded by the photo mask. The semiconductor 402 under the N+ photo mask but beyond the gate metal 404 is lightly doped. One square end of the semiconductor 402 may be a source and another square end of the semiconductor 402 may be a drain. It will be appreciated by those skilled in the art that the shapes of the gate metal and the N+ photo mask, as well as the semiconductor, may vary.

Generally, a photoresist film may be made of a photosensitive material; exposure to light (or particular wavelengths of light) to develop the photoresist. The developed photoresist may be insoluble or soluble to a developer. There may be two types of photoresist, a positive photoresist and a negative photoresist. The positive photoresist is soluble to the photoresist developer. The portion of the positive photoresist that is unexposed remains insoluble to the photoresist developer. The negative resist is a type of photoresist in which the portion of the photoresist that is exposed to light becomes insoluble to the photoresist developer. The unexposed portion of the photoresist is dissolved by the photoresist developer.

In embodiments disclosed below, a positive photoresist is first deposited on a surface, and then light is selectively passed through a patterned photo mask that may block light in certain areas. The unexposed photoresist film is developed through the patterned photo mask to form the photoresist patterns as shown. In other words, the photoresist has the same pattern as the photo mask. The unexposed photoresist film protects the layers underneath during an etching process, such that the portion exposed by the photoresist may be completely removed by the etching process, such as a wet etching. Portions of underlying layers that are protected by photoresist generally are not removed or otherwise etched. After etching to form a pattern of a deposited layer by using photoresist, the insoluble photoresist is removed prior to the next deposition operation. Different masks may be provided to form various films with different patterns. In alternative embodiments, different photoresist may be used. It will be appreciated by those skilled in the art that the photo mask will vary with the negative photoresist.

FIG. 4B shows a sample cross-sectional view of the TFT stack in the pixel area for the one-step LDD doping process. Arrows A-A in FIG. 4A show where the cross-section of FIG. 4B is taken. The cross-section view shows only the upper portion above a centerline through the gate metal as an arrow C shows. Gate metal 404 is patterned and covers a first portion 402A of the semiconductor 402 and exposes a second portion 402B of the semiconductor. An insulation layer 410 is arranged between the gate metal 404 and the semiconductor layer 402 and may cover the entire semiconductor layer 402. During a first doping with a N− (low) dopant, the exposed portion 402B is doped and denoted by the label N− (low).

FIG. 4C shows a sample cross-sectional view of the TFT stack in the pixel area after patterning photoresist with a N+ photo mask and a second doping or N+ doping following the operation illustrated in FIG. 4B. As shown in FIG. 4C, photoresist 406 patterned with a N+ photo mask covers a region 402C of the doped second portion 402B and exposes a region 402D of the doped second portion 402B. Then, the region 402D is further doped during a second doping (e.g., a N+ doping).

FIG. 4D shows a sample cross-sectional view of the TFT stack in the pixel area after photoresist stripping following the operation illustrated in FIG. 4C. The photoresist 406 is removed as shown in FIG. 4D. Region 402C has a N− (low) doping in the pixel area.

FIG. 4E shows a sample top view of the gate metal, semiconductor, and N+ photo mask of FIG. 4A in the GIP/demultiplexing areas for the one-step LDD doping process of FIG. 4A. Arrows B-B shown in FIG. 4E show where the cross-section is. The cross-section view as shown in FIGS. 4F-4H shows only the upper portion above a centerline through the gate metal as arrow C shows.

FIG. 4F shows a sample cross-sectional view of the TFT stack in the GIP/demultiplexing (Demux) area for the conventional one-step LDD doping process. In this embodiment, the N+ photo mask 408 overlaps with the gate metal 404 and extends beyond the gate metal 404. The N+ photo mask 408 also overlaps with the semiconductor 402. The non-overlapping area between the gate metal and the N+ photo mask is lightly doped denoted by N− (low) while the non-overlapping area between the N+ photo mask and the semiconductor is heavily doped and denoted by N+. The non-overlapping region 402B between the gate metal 404 and the semiconductor 402 is lightly doped with a N− (low) dopant during a first doping.

FIG. 4G shows a sample cross-sectional view of the TFT stack in the GIP/demultiplexing area after a second doping or N+ doping following the operation of FIG. 4F. The photoresist 406 covers region 402C, but exposes region 402D. Thus, the region 402D is further doped during the second doping, and is denoted by N+.

FIG. 4H shows a sample cross-sectional view of the TFT stack in the GIP/demultiplexing area after photoresist stripping. The region 402C has a dopant concentration labeled N− (low) in the GIP/demultiplexing area, which is the same as the dopant concentration N− (low) in the pixel area, as shown in FIG. 4D.

Figure 4I:
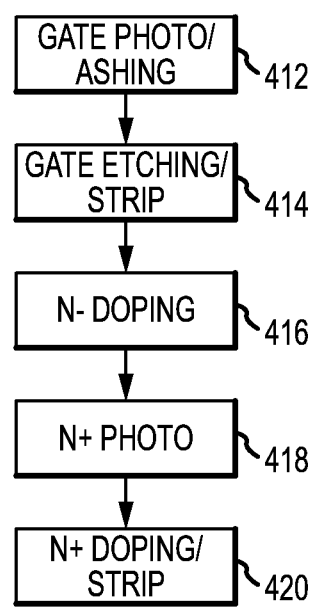
FIG. 4I is a flow chart illustrating steps for forming N− (low)-doped regions in the pixel area and the GIP and demultiplexing area.

FIG. 4I is a flow chart illustrating steps for forming N−(low)-doped regions in the pixel area and the GIP and demultiplexing area. Each step may have one or more operations. At step 412, a photoresist layer (not shown in FIGS. 4B and 4F) is first deposited, and then is patterned with a pre-determined gate mask to cover a portion of the gate metal layer by ashing. At step 414, an uncovered remaining portion of the gate metal layer by the photoresist layer is etched to form a gate metal pattern 404 as shown in FIGS. 4B and 4F. The photoresist layer is then stripped after the gate etching. At step 416, the exposed portion of semiconductor layer is doped with a N− (low) dopant during a first doping or N− (low) doping. The photoresist (not shown) is removed or stripped either before the first doping or after doping. The doped area is denoted as N− (low) in the exposed region (see FIGS. 4B and 4F). At the next step 418, a photoresist layer 406 is first deposited and then patterned with a N+ photo mask to cover the gate metal and extends beyond the gate metal to cover a portion 402C of the N− (low) region 402B, while another portion 402D of the N− (low) region 402B is exposed. The exposed area will be further doped during a second doping operation. The doped area is denoted by N+ next to the N− (low) region in the pixel area (see FIG. 4C) and N+ next to the N− (low) region in the GIP/demultiplexing area (see FIG. 4G). At step 420, the photoresist 406 is stripped after the second doping at step 418. The doped area is denoted by N+ and N− (low) (see FIG. 4D) for the pixel area and N+ and N− (low) (see FIG. 4H) for the GIP and demultiplexing TFT area. Note that the LDD region 402C has only one doping does N− (low) for the pixel area, as well as the GIP and demultiplexing areas.

The present disclosure provides multiple embodiments for fabricating two doped regions for an LDD. In a first embodiment, an additional mask is used in a two-step LDD doping process. The additional mask may reduce product throughput by more than 10%. That is, product cycle time increase resulting from the use of the second mask may be up to 10%. Therefore, it is desirable to reduce the need of the additional mask. In a second embodiment and a third embodiment, the two doped regions may be obtained by using the same number of masks as the one-step LDD doping process.

In a first embodiment, an additional mask may be used to achieve the two LDD doping areas. A N+ mask and a N− mask are used for N+ doping and N− doping for the two-step LDD doping process.

FIG. 5A shows a sample top view of a gate metal, a semiconductor, a N− photo mask, and a N+ photo mask in the pixel area in accordance with embodiments of a two-step LDD doping process. FIGS. 5B-5F illustrate cross-sectional views of the TFT stack for the pixel area at various process steps of the two-step LDD doping process. FIG. 5G shows a sample top view of the gate metal, semiconductor, and N+ photo mask of FIG. 5A for the GIP/demultiplexing areas in accordance with embodiments of the two-step LDD doping process. FIGS. 5H-5L illustrate cross-sectional views of the TFT stack for the GIP and demultiplexing area during the process steps of the two-step LDD doping process; these figures generally correspond to FIGS. 5B-5F. FIGS. 5F and 5L show different dopant concentrations in LDD region 502D, i.e. a N− (low) doping region in the pixel area and a N− doping region in the GIP and demultiplexing area. N− has a higher dopant concentration than N− (low). The region next to the LDD region is heavily doped and is denoted by N+. This region has a higher dopant concentration than the N− region.

As shown in FIG. 5A, the entire pixel area is covered by a N− photo mask 512. It should be appreciated that the N− photo mask is used to prevent N− doping in the pixel area, as described below; This is different from FIG. 4A, where the N− mask is not present in the pixel area. FIG. 5G shows that the N− photo mask 512 does not cover the GIP/demultiplexing area. Only mask 508 is present to cover the gate metal 504 and to extend beyond the gate metal 504 in both FIGS. 5A and 5G. The N− photo mask 512 allows fabrication of regions having different dopant concentrations in the pixel area and the GIP/demultiplexing area.

FIG. 5B shows a sample cross-sectional view of a TFT stack in the pixel area after a first doping or N− (low) doping for a two-step LDD doping process. As shown in FIG. 5B the exposed semiconductor region 502B is lightly doped after a first doping or a N− (low) doping. An insulation layer 510 is arranged between the gate metal 504 and the semiconductor layer 502 and may cover the entire semiconductor layer 502.

FIG. 5C shows a sample cross-sectional view of the TFT stack in the pixel area after patterning photoresist with a N− photo mask and a second doping denoted by N− (low) following the operation illustrated in FIG. 5B. As shown in FIG. 5C, a photoresist layer 506A covers both the gate metal 510 and the region 502B. N− photoresist layer 506B is patterned with a N− photo mask, such that the N− photoresist layer 506A is formed as shown in FIG. 5C. The photoresist 506A covers the entire semiconductor regions 502A and 502B in the pixel area to protect region 502B from being doped during a second doping or N− (low) doping (see FIGS. 5A and 5C). Referring to FIG. 5A, FIG. 5A also shows that the N− photo mask 512 covers the entire pixel area to protect the pixel from doping.

FIG. 5D shows a sample cross-sectional view of the TFT stack in the pixel area after photoresist stripping following the operation illustrated in FIG. 5C. FIG. 5D illustrates that the photoresist 506A is removed.

FIG. 5E shows a sample cross-sectional view of the TFT stack in the pixel area after patterning photoresist with a N+ photo mask and a third doping following the operation illustrated in FIG. 5D. As shown in FIG. 5E, region 502D is covered by a photoresist 506B patterned with a N+ photo mask. The exposed region 502C is further doped during a third doping or N+ doping.

FIG. 5F shows a sample cross-sectional view of the TFT stack in the pixel area after photoresist stripping following the operation illustrated in FIG. 5E. FIG. 5F illustrates that the photoresist 506B is removed.

FIG. 5G shows a sample top view of the gate metal, semiconductor, and N+ photo mask of FIG. 5A for the GIP/demultiplexing areas for the two-step LDD doping process of FIG. 5A. As shown in FIG. 5G, the N− photo mask 512 does not cover the GIP/demultiplexing area such that the region 502B in the GIP/demultiplexing area can be doped while the region 502B in the pixel area is not doped.

FIG. 5H shows a sample cross-sectional view of the TFT stack of FIG. 5B in the GIP/demultiplexing area after the first doping or N− (low) doping of FIG. 5B. As shown in FIG. 5H, the exposed semiconductor region 502B is lightly doped after a first doping or a N− (low) doping. An insulation layer 510 is arranged between the gate metal 504 and the semiconductor layer 502 and may cover the entire semiconductor layer 502.

FIG. 5I shows a sample cross-sectional view of the TFT stack of FIG. 5C in the GIP/demultiplexing area after a second doping or N− (low) doping following the operation illustrated in FIG. 5H. As shown in FIG. 5I, the region 502B in the GIP area and demultiplexing area is not covered by the photoresist 506A during the second doping with the N− photoresist. The region 502B in the GIP/demultiplexing area has a doping N−.

FIG. 5J shows a sample cross-sectional view of the TFT stack of FIG. 5D in the GIP/demultiplexing area after photoresist stripping following the operation illustrated in FIG. 5I. Although FIG. 5J looks identical to FIG. 5I, the step of N− photo mask/N− (low) doping affects the pixel area, as the changes are shown in FIGS. 5C and 5D for the pixel area.

FIG. 5K shows a sample cross-sectional view of the TFT stack of FIG. 5E in the GIP/demultiplexing area after patterning photoresist with the N+ photo mask and the third doping or N+ doping of FIG. 5E following the operation illustrated in FIG. 5J. As shown in FIG. 5K, region 502D is covered by a photoresist 506B patterned with a N+ photo mask. The exposed region 502C is further doped during a third doping or N+ doping.

FIG. 5L shows a sample cross-sectional view of photoresist stripping of FIG. 5F following the operation illustrated in FIG. 5K. As shown in FIG. 5L, the photoresist 506B is removed and the dopant concentration is denoted by N+ and N− (low) (see FIG. 5F) for the pixel area and N− and N+ (see FIG. 5L) for the GIP and demultiplexing TFT area. Top view of regions 502C and 502D are shown in FIGS. 5A and 5G.

Figure 5M:
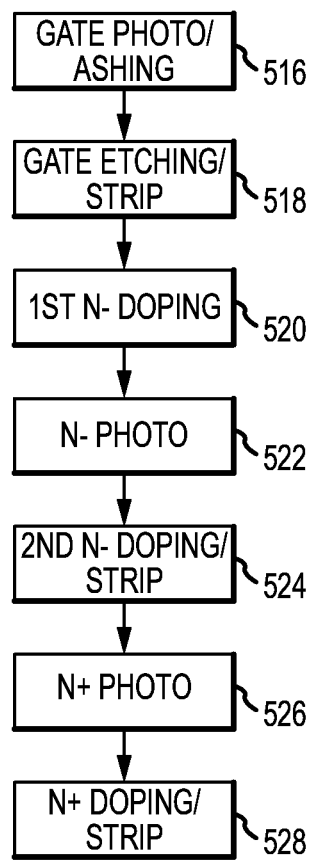
FIG. 5M is a flow chart illustrating steps for forming two different LDD doping regions in the pixel area and in the GIP/demultiplexing area.

FIG. 5M is a flow chart illustrating steps for forming two different LDD doping regions in the pixel area and in the GIP/demultiplexing area. At step 516, a photoresist layer (not shown in FIGS. 5B and 5H) is patterned with a pre-determined photo mask to cover a portion of the gate metal layer. At step 518, an uncovered remaining portion of the gate metal layer is etched to form a gate metal pattern 504. After etching the gate metal layer, the photoresist is removed or stripped. At step 520, the exposed portion of semiconductor layer 502B is doped during a first doping. The dopant concentration is denoted as N− (low) in the exposed region (see FIGS. 5B and 5H). At the next step 522, a photoresist pattern 506A formed with a N− photo mask covers the first doped N− (low) region in the pixel area, but the N− photo mask does not cover—the first doped N− (low) region in the GIP/demultiplexing area. At step 524, the exposed region 502B in the GIP/demultiplexing area will be further doped during a second doping operation with a N− (low) dose (see FIG. 5I). The photoresist pattern 506A is then stripped after the doping. At the next step 526, a N+ photoresist pattern 506B covers a portion 502D of the doped area in both the pixel area and the GIP/demultiplexing area (see FIGS. 5E and 5K). At step 528, the exposed portion 502C of the semiconductor is further doped, followed by stripping the photoresist 506B.

In a second embodiment, a half-tone mask process with a N+ mask for photoresist is used for obtaining two doping concentrations in two different LDD regions, one doping concentration in the pixel area and another doping concentration in the GIP/demultiplexing areas. This half-tone mask process eliminates the use of the N− mask used in the first embodiment, i.e. the two-step LDD doping process.

FIGS. 6A-6E illustrate cross-sectional views of the TFT stack for the pixel area at various process steps for the half-tone mask LDD doping process. FIGS. 6F-6K illustrate cross-sectional views of the TFT stack for the GIP and demultiplexing area during the corresponding process steps as the FIGS. 6A-6E.

FIG. 6A shows a sample cross-sectional view of a TFT stack in the pixel area after gate etching for a half-tone mask LDD doping process. As shown in FIG. 6A, a half-tone photoresist 606 covers the gate metal 604 that covers a semiconductor layer 602 including a first region 602A and a second region 602B. The half-tone photoresist 606 includes a thicker region 602A above the first region 602A of the semiconductor 602 and a thinner region 606B above the second region 602B of the semiconductor. The second region 602 will be doped and divided into lightly doped region 602C and heavily doped region 602D.

FIG. 6B shows a sample cross-sectional view of the TFT stack in the pixel area after half-tone photoresist ashing following the operation illustrated in FIG. 6A. As shown in FIG. 6B, this thinner photoresist region 606B is ashed while the thicker photoresist 606A is reduced to a thinner photoresist 606C. The photoresist may be ashed by an oxygen plasma. However, the gate metal 604 still covers the semiconductor region 602B in the pixel area, which protects the semiconductor region 602B from being doped during a first doping. An insulation layer 610 is arranged between the gate metal 604 and the semiconductor layer 602 and may cover the entire semiconductor layer 602.

FIG. 6C shows a sample cross-sectional view of the TFT stack in the pixel area after gate etching and a second doping denoted by N− (low) following the operation illustrated in FIG. 6B. As shown in FIG. 6C, the gate metal 604 is etched and the semiconductor region 602B is lightly doped during a second doping, and is denoted by N− (low).

FIG. 6D shows a sample cross-sectional view of the TFT stack in the pixel area after patterning photoresist with a N+ photo mask and a third doping or N− (low) doping following the operation illustrated in FIG. 6C. As shown in FIG. 6D, a N+ photoresist layer 606D covers the etched gate metal 604 and extends beyond the etched gate metal 604 such that a portion 602C of the semiconductor region 602B is covered by the N+ photoresist 606D. Then, an exposed region 602D of the semiconductor region 602B is further doped during a third doping.

FIG. 6E shows a sample cross-sectional view of the TFT stack in the pixel area after photoresist stripping following the operation illustrated in FIG. 6D. As shown in FIG. 6E, the exposed region 602D has a dopant concentration denoted by N+, which is a heavily doped region and is next to the region lightly doped region 602C or LDD region. After the third doping, the photoresist 606D is removed.

FIG. 6F shows a sample cross-sectional view of the TFT stack of FIG. 6A in the GIP/demultiplexing area after gate and photoresist etching for the half-tone mask LDD doping process of FIG. 6A. As shown in FIG. 6F, the photoresist 606B of FIG. 6A is removed and the gate metal 604 is etched to expose the semiconductor region 602B in the GIP and demultiplexing TFT area.

FIG. 6G shows a sample cross-sectional view of the TFT stack of FIG. 6B in the GIP/demultiplexing area after photoresist ashing and the first doping or N− (low) doping of FIG. 6B following the operation illustrated in FIG. 6F. As shown in FIG. 6G, the thicker photoresist 606A is reduced to a thinner photoresist 606C and the semiconductor region 602B is lightly doped during the first doping and is denoted by a dopant concentration N− (low).

FIG. 6H shows a sample cross-sectional view of the TFT stack of FIG. 6C in the GIP/demultiplexing area after photoresist stripping and the second doping denoted by N− (low) of FIG. 6C following the operation illustrated in FIG. 6G. As shown in FIG. 6H, the region 602B with the dopant concentration N− (low) is further doped during the second doping operation, such that the semiconductor region 602B is denoted by a higher dopant concentration N−.

FIG. 6I shows a sample cross-sectional view of the TFT stack of FIG. 6D in the GIP/demultiplexing area after patterning photoresist with the N+ photo mask and the third doping or N+ doping following the operation illustrated in FIG. 6H. As shown in FIG. 6I, the N+ photoresist 606D covers the etched gate metal 604 and extends beyond the etched gate metal 604, but exposes a portion 602D of the semiconductor region 602B. The portion 602D is further doped during the third doping.

FIG. 6J shows a sample cross-sectional view of the TFT stack of FIG. 6E in the GIP/demultiplexing area after photoresist stripping of FIG. 6E following the operation illustrated in FIG. 6I. As shown in FIG. 6J, the exposed region 602D is heavily doped, and is denoted by N+ doping. The region 602D is next to the region 602C denoted by N− doping. As shown in FIGS. 6E and 6K, for region 502D the dopant concentration N− in the GIP/demultiplexing area is different from the dopant concentration N− (low) in the pixel area.

In a third embodiment, an LDD doping process with a N− mask for photoresist is used for creating two LDD doped regions, one in the pixel area and one in the GIP/demultiplexing areas. FIGS. 7A-7E illustrate cross-sectional views of the TFT stack for the pixel area at various process steps for the LDD doping process. FIGS. 7F-7K illustrate cross-sectional views of the TFT stack for the GIP and demultiplexing area during the corresponding process steps as the FIGS. 7A-7E.

FIG. 7A shows a sample cross-sectional view of a TFT stack in the pixel area after gate etching and a first doping or N+ doping in the pixel area for an LDD doping process. As shown in FIG. 7A, a photoresist 706A covers the gate metal 704 that exposes a semiconductor region 702B but covers a semiconductor region 702A. This exposed region 702B is heavily doped denoted by N+ after a first doping.

FIG. 7B shows a sample cross-sectional view of the TFT stack in the pixel area after photoresist ashing and gate etching and a second doping or N− (low) doping following the operation illustrated in FIG. 7A. As shown in FIG. 7B, a portion of the photoresist 706A is ashed, such that a remaining portion 706B covers the semiconductor region 702A and exposes a region 702C that is next to the exposed region 702B with a N+ doping. This region 702C is lightly doped denoted by N− (low) after a second doping. Then, the photoresist 706B is removed. An insulation layer 710 is arranged between the gate metal 704 and the semiconductor layer 702 and may cover the entire semiconductor layer 702.

FIG. 7C shows a sample cross-sectional view of the TFT stack in the pixel area after photoresist stripping following the operation illustrated in FIG. 7B. As shown in FIG. 7C, the photoresist 706B is stripped.

FIG. 7D shows a sample cross-sectional view of the TFT stack in the pixel area after patterning photoresist with a N− photo mask and a third doping or N− (low) doping following the operation illustrated in FIG. 7C. As shown in FIG. 7D, a photoresist 706C patterned with a N− photo mask is used to cover the region 702C with a N− (low) doping, such that the dopant concentration underneath the covered region 702C in the pixel area may not change during a third doping.

FIG. 7E shows a sample cross-sectional view of the TFT stack in the pixel area after photoresist stripping following the operation illustrated in FIG. 7D. As shown in FIG. 7E, the LDD region 702B for the pixel area has a dopant concentration N− (low).

FIG. 7F shows a sample cross-sectional view of the TFT stack of FIG. 7A in the GIP/demultiplexing areas after gate etching and the first doping or N+ doping for the LDD doping process of FIG. 7A. As shown in FIG. 7F, region 702B in the GIP/demultiplexing area is heavily doped during the first doping of FIG. 7A.

FIG. 7G shows a sample cross-sectional view of the TFT stack of FIG. 7B in the GIP/demultiplexing areas after photoresist ashing and gate etching and the second doping or N− (low) doping of FIG. 7B following the operation illustrated in FIG. 7F. As shown in FIG. 7G, region 702C is lightly doped in the GIP/demultiplexing area and is denoted by N− (low) during the second doping of FIG. 7B. The photoresist 706B is removed, as shown in FIG. 7h).

FIG. 7H shows a sample cross-sectional view of the TFT stack of FIG. 7C in the GIP/demultiplexing areas after photoresist stripping of FIG. 7C following the operation illustrated in FIG. 7G. As shown in FIG. 7H, the photoresist 706B is stripped.

FIG. 7I shows a sample cross-sectional view of the TFT stack of FIG. 7D in the GIP/demultiplexing areas after the third doping or N− (low) doping of FIG. 7D following the operation illustrated in FIG. 7H. As shown in FIG. 7I, photoresist 706C is present in the pixel area, but is not present in the GIP/demultiplexing area, such that the region 702C with a N− (low) doping as shown in FIG. 7H in the GIP/demultiplexing area is additionally doped during the third doping and is now denoted as N−. The region 702B with a N+ doping is also further doped, although the region 702B is still denoted by N+. In this third embodiment, the N+ mask used in the first embodiment is not needed while only N− mask is used. After the third doping, the photoresist 706C is removed.

FIG. 7J shows a sample cross-sectional view of the TFT stack of FIG. 7E in the GIP/demultiplexing areas after photoresist stripping of FIG. 7E following the operation illustrated in FIG. 7I. As shown in FIG. 7J, the LDD for the GIP and demultiplexing TFT areas has a dopant concentration of N− in region 702B or LDD region, which is different from the doping concentration N− (low) in region 702B or LDD region for the pixel area.

In a particular embodiment, the semiconductor is a polycrystalline silicon. It will be appreciated by those skilled in the art that the semiconductor may vary in materials. The semiconductor may be a p-type or an n-type. The semiconductor may be doped by processes known in the art, such as diffusion, ion implantation among others.

The gate metal may be formed of one or more layers of a conductive material selected from a group consisting of molybdenum or molybdenum alloys such as molybdenum/ tungsten alloy (MoW). The gate insulator may be formed of one or more layers of one or more dielectric materials, each material being selected from a group consisting of silicon oxide ($SiO_2$), silicon nitride ($SiN_x$), and aluminum oxide ($Al_2O_3$).

In a fourth embodiment, a length for the LDD region denoted by a first dopant dose N− (low) in pixel area may be different from a length for the LDD region denoted by a second dopant dose N− in the GIP/demultiplexing area. Specifically, the length for the N− LDD region may be longer than the N− (low) LDD region in the GIP/demultiplexing area than in the pixel area. The different lengths of the LDD regions may help improve system reliability. Generally, LDD may reduce hot carrier stress induced by high energy electrons due to a high drain voltage. Longer length of the LDD in the GIP and demultiplexing area may reduce the electric field from the gate to the drain. The lower electric field may reduce the hot carrier stress. In the fourth embodiment, no extra mask is introduced to generate two doping LDD regions in the pixel area and the GIP//demultiplexing area and each LDD region may have a different length.

Figure 8A:
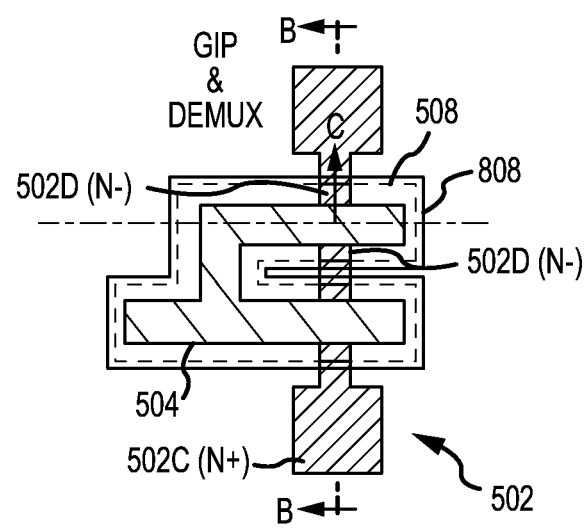
FIG. 8A is a sample top view of the gate metal, semiconductor, and N− photo mask for the GIP/demultiplexing areas for a self-align light drain doping (SALDD) process.

FIG. 8A is a sample top view of the gate metal, semiconductor, and N− photo mask for the GIP/demultiplexing areas for a self-align light drain doping (SALDD) process. Note that the N− photo mask 808 (in solid line) in the SALDD covers a larger area than the mask 508 (in dash line) shown in FIG. 5B. The N− photo mask 808 does not cover the GIP/demultiplexing area such that the LDD region in the GIP/demultiplexing area may be doped while the LDD region in the pixel area may not be doped.

FIGS. 8B-8F illustrate cross-sectional views of the TFT stack for the pixel area at various process steps for the SALDD process. FIGS. 8G-8K illustrate cross-sectional views of the TFT stack for the GIP and demultiplexing area during the corresponding process steps as the FIGS. 8B-8F.

FIG. 8B shows a sample cross-sectional view of a TFT stack in the pixel area after gate etching and N+ doping for SALDD process. As shown in FIG. 8B, with a gate photo mask 806 (e.g. half tone photoresist mask), gate pattern is formed by etching the portion of gate metal layer 804. Before etching the gate metal layer 804, a thicker portion photoresist 806A of the half tone photoresist mask 806 covers the gate metal 804 above a first region 802A of a semiconductor layer 802, while the gate metal above a second region 802D of the semiconductor layer 802 is etched. An insulation layer 810 is arranged between the gate metal 804 and the semiconductor layer 802 and may cover the entire semiconductor layer 802. After etching the gate metal, the exposed semiconductor region 802D is heavily doped during the first doping, denoted by N+ doping.

FIG. 8C shows a sample cross-sectional view of the TFT stack in the pixel area after half-tone photoresist ashing, gate etching, and first N− doping following the operation illustrated in FIG. 8B. As shown in FIG. 8C, the thicker photoresist 806A is reduced to a thinner photoresist 806C by ashing, for example, ashed by oxygen plasma. Ashed photoresist 806C is thinner than photoresist 806A. Also, ashed photoresist 806C is shorter than photoresist 806A such that a portion of the gate metal 804 is etched. After the gate etching, an additional semiconductor region is exposed for doping. The exposed semiconductor region 802B is lightly doped during a second doping, denoted by a dopant concentration N− (low), which is also a first light doping or N− doping. The region 802B or LDD region 802B has a length $L_1$ in the pixel area, and is between the heavily doped region 802D and non-doped region 802A.

FIG. 8D shows a sample cross-sectional view of the TFT stack in the pixel area after photoresist stripping following the operation illustrated in FIG. 8C. As shown in FIG. 8D, the photoresist 806C is stripped or removed, such as by dissolving the photoresist using a solution.

FIG. 8E shows a sample cross-sectional view of the TFT stack in the pixel area after placing N− photo mask and second N− doping following the operation illustrated in FIG. 8D. As shown in FIG. 8E, a N− photoresist mask 806D covers the patterned gate metal 804 and extends beyond the patterned gate metal 804 such that the LDD region 802B denoted by a dopant dose N− (low) is covered by the N− photoresist mask 806D. Then, an exposed portion of the heavily doped region 802D denoted by dopant dose N+ is further doped during a third doping, which is also a second N− doping.

FIG. 8F shows a sample cross-sectional view of the TFT stack in the pixel area after photoresist stripping following the operation illustrated in FIG. 8E. After the third doping, the photoresist 806D is stripped. As shown in FIG. 8F, the exposed region 802D has a dopant concentration denoted by N+, which is a heavily doped region and is next to the LDD region 802B denoted by N– (low).

FIG. 8G shows a sample cross-sectional view of the TFT stack of FIG. 8B in the GIP/demultiplexing area after gate etching and N+ doping for the SALDD process of FIG. 8B. As shown in FIG. 8G, with a gate photo mask (e.g. half-tone photoresist mask), gate pattern is formed by etching the portion of gate metal layer 804. The half-tone photoresist mask 806 includes a thicker portion 806A and a thinner portion 806B covers the gate metal 604. The thinner portion 806B is near the edge of the photoresist mask 806 and has a length denoted by "L", which controls the difference between the length of the LDD in the GIP area and the length of the LDD in the pixel area. After etching the gate metal 804, the exposed semiconductor region 802D is heavily doped during the first doping, denoted by N+ doping.

FIG. 8H shows a sample cross-sectional view of the TFT stack of FIG. 8C in the GIP/demultiplexing area after photoresist ashing and a second doping or N– (low) doping following the operation illustrated in FIG. 8G. As shown in FIG. 8H, the photoresist 806 is ashed such that the thinner photoresist 806B is removed and the photoresist above the N– (low) region 802B is also removed while the thicker photoresist 806A is reduced to a thinner ashed photoresist 806C. Similar to the pixel area, after ashing the photoresist 806, a portion of the gate metal 804 is etched such that an additional semiconductor region is exposed. Again, the photoresist may be partially removed or ashed by oxygen plasma. The exposed semiconductor region is lightly doped during the second doping such that the semiconductor region 802B is denoted by a dopant concentration N– (low). The length of the LDD region 802B is $L_2$, which may be longer than the length $L_1$ of the LDD 802B in the pixel area.

FIG. 8I shows a sample cross-sectional view of the TFT stack of FIG. 8D in the GIP/demultiplexing area after photoresist stripping following the operation illustrated in FIG. 8H. As shown in FIG. 8I, the photoresist is stripped.

FIG. 8J shows a sample cross-sectional view of the TFT stack of FIG. 8E in the GIP/demultiplexing area after placing N– photo mask and second N– doping following the operation illustrated in FIG. 8I. As shown in FIG. 8J, the N– photo mask 806D does not cover the semiconductor region 802B and 802D such that the lightly doped draining region 802B is further doped with a third light doping to form a region 802C denoted by N–.

FIG. 8K shows a sample cross-sectional view of the TFT stack of FIG. 8F in the GIP/demultiplexing area after photo resist stripping following the operation illustrated in FIG. 8J. The photoresist 806D is removed. As shown in FIGS. 8F and 8K, the lightly doped region 802C has the dopant concentration N– and a length $L_2$ in the GIP/demultiplexing area, while the lightly doped region 802B has a dopant concentration N– (low) and a length $L_1$ in the pixel area. Note that $L_2$ in the GIP/demultiplexing area is roughly equal to $L_1+L$.

In the SALDD process, no extra mask is used for controlling two different doping doses and two different lengths of the light drain doping region in the pixel area and the GIP and demultiplexing area. Additionally, for the SALDD, no misalignment occurs such that the LDD length may be more accurately controlled. Specifically, if a process uses an extra mask, such as the first embodiment shown in FIGS. 5A-5M, an alignment between the mask for gate metal and the extra mask may be required. The alignment may have errors, which may affect the LDD length.

In a particular embodiment, the first dopant concentration is A, and the second dopant concentration is B (A<B or A>B). It should be appreciated that the first and second dopant concentrations may be varied as necessary or desired, such that the lightly and heavily doped regions may have any suitable or desired dopant concentrations.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A method of fabricating thin-film transistors (TFTs) for a display having an array of pixels, the method comprising:
    placing a first photoresist mask over a TFT stack including a conductive gate layer, and a semiconducting layer, the mask having a thicker portion of photoresist covering a pixel area, and the mask having a half tone mask with a thicker portion of photoresist and a thinner portion of photoresist near edge covering an area surrounding the pixel area;
    asking a top portion of the first photoresist mask such that the thinner portion of the photoresist is removed;
    etching a portion of the conductive gate layer to expose a portion of the semiconductor layer; and
    doping the semiconductor layer with a first doping dose such that a length of light drain doping (LDD) region in the pixel area is shorter than a length of the LDD in the area surrounding the pixel area.

2. The method of claim 1, further comprising covering the pixel area with a photo mask; and doping the semiconductor layer with a second doping dose such that the LDD in the pixel area has a lower dose than the LDD in the area surrounding the pixel area.

3. The method of claim 1, further comprising removing the first photoresist mask.

4. The method of claim 1, the step of ashing a top portion of the first photoresist mask comprising ashing with an oxygen plasma.

5. The method of claim 1, wherein the gate layer comprises one or more layers of one or more dielectric materials, each material selected from a group consisting of silicon oxide ($SiO_2$), silicon nitride ($SiN_x$), aluminum oxide ($Al_2O_3$), and organic material.

6. The method of claim 1, wherein the gate comprises one or more layers of a conductive material selected from a group consisting of molybdenum, molybdenum/tungsten alloy (MoW), and molybdenum alloys.

7. The method of claim 1, wherein the semiconductor comprises a polycrystalline silicon.

8. A TFT stack for a display having an array of pixels, the TFT stack comprising:
    a first region of the TFT stack in an active area of the pixels; and
    a second region of the TFT stack in an area surrounding the active area,
    wherein the TFT stack comprises a semiconductor layer having a non-doped region connected to a doped region, the doped region having a lightly doped drain (LDD) region and a heavily doped region, the LDD region between the non-doped region and the heavily doped region, wherein the first region of the TFT stack comprises a first gate metal portion over a first portion of the non-doped region of the semiconductor layer, and a first portion of the LDD region having a first length, and wherein the second region of the TFT stack comprises a second gate metal portion over a second portion of the non-doped region of the semiconductor layer, and a second portion of the LDD region having a second length that is different than the first length.

9. A TFT stack for a liquid crystal display (LCD) having an array of pixels, the TFT stack comprising:

a first region of the TFT stack in an active area of the pixels; and a second region of the TFT stack in an area surrounding the active area, wherein the TFT stack comprises a semiconductor layer having a non-doped region connected to a doped region, the doped region having a lightly doped drain (LDD) region and a heavily doped region, the LDD region between the non-doped region and the heavily doped region, wherein the first region of the TFT stack comprises a first gate metal portion over a first portion of the non-doped region of the semiconductor layer, and a first portion of the LDD region having a first length, and wherein the second region of the TFT stack comprises a second gate metal portion over a second portion of the non-doped region of the semiconductor layer, and a second portion of the LDD region having a second length, wherein the second length is longer than the first length.

10. The TFT of claim 8, wherein the first portion of the LDD region has a first doping dose, and the second portion of the LDD region has a second doping dose that is different than the first doping dose.

11. The TFT of claim 10, wherein the first doping dose is lower than the second doping dose.

12. The TFT of claim 8, wherein each of the first gate metal portion and the second gate metal portion comprises one or more layers of a conductive material selected from a group consisting of copper, copper alloy, aluminum, aluminum alloy, titanium, and molybdenum.

13. The TFT of claim 8, wherein the semiconductor layer comprises polycrystalline silicon.

14. The TFT of claim 8, wherein the second length is longer than the first length.

* * * * *

UNITED STATES PATENT AND TRADEMARK OFFICE
CERTIFICATE OF CORRECTION

| | | |
|---|---|---|
| PATENT NO. | : 9,685,557 B2 | Page 1 of 1 |
| APPLICATION NO. | : 13/801261 | |
| DATED | : June 20, 2017 | |
| INVENTOR(S) | : Cheng-Ho Yu et al. | |

It is certified that error appears in the above-identified patent and that said Letters Patent is hereby corrected as shown below:

In the Claims

Column 18, Line 31, "asking a top portion" should read --ashing a top portion--.

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*